United States Patent
Ahn et al.

(10) Patent No.: US 12,057,421 B2
(45) Date of Patent: Aug. 6, 2024

(54) NONVOLATILE MEMORY DEVICES AND DATA STORAGE SYSTEMS INCLUDING THE SAME

(71) Applicant: Samsung Electronics Co., Ltd., Suwon-si (KR)

(72) Inventors: Jaeho Ahn, Seoul (KR); Jiwon Kim, Seoul (KR); Sungmin Hwang, Hwaseong-si (KR); Joonsung Lim, Seongnam-si (KR); Sukkang Sung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 330 days.

(21) Appl. No.: 17/470,644

(22) Filed: Sep. 9, 2021

(65) Prior Publication Data

US 2022/0173060 A1 Jun. 2, 2022

(30) Foreign Application Priority Data

Nov. 30, 2020 (KR) .......................... 10-2020-0165067

(51) Int. Cl.
*H01L 25/065* (2023.01)
*H01L 23/00* (2006.01)
*H01L 25/18* (2023.01)

(52) U.S. Cl.
CPC .......... *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ....... H01L 25/0657; H01L 2224/08145; H01L 24/08; H01L 25/18; H01L 2924/1431; H01L 2924/14511; H01L 2224/32145; H10B 43/40; H10B 41/35; H10B 43/35
See application file for complete search history.

(56) References Cited

U.S. PATENT DOCUMENTS

| | | | |
|---|---|---|---|
| 9,424,928 B2 | 8/2016 | Hwang et al. | |
| 10,283,493 B1 | 5/2019 | Nishida | |
| 10,381,374 B2 | 8/2019 | Tagami et al. | |
| 10,600,781 B1 | 3/2020 | Xiao et al. | |
| 10,643,704 B2 | 5/2020 | Oh et al. | |
| 10,651,153 B2 | 5/2020 | Fastow et al. | |
| 2019/0296041 A1 | 9/2019 | Yamasaka et al. | |
| 2020/0098748 A1* | 3/2020 | Xiao | H10B 43/27 |
| 2022/0302157 A1* | 9/2022 | Kim | H01L 23/5226 |

* cited by examiner

*Primary Examiner* — Thanh Y. Tran
(74) *Attorney, Agent, or Firm* — Myers Bigel, P.A.

(57) ABSTRACT

A nonvolatile memory device and a data storage system including the same are provided. The nonvolatile memory device includes: a first structure including at least one first memory plane; and a second structure bonded to the first structure and including at least one second memory plane, wherein the number of the at least one first memory plane included in the first structure is different from the number of the at least one second memory plane included in the second structure.

18 Claims, 24 Drawing Sheets

NONVOLATILE MEMORY DEVICES AND DATA STORAGE SYSTEMS INCLUDING THE SAME

CROSS-REFERENCE TO RELATED APPLICATION

This application is based on, and claims priority under, 35 U.S.C. § 119 to Korean Patent Application No. 10-2020-0165067, filed on Nov. 30, 2020, in the Korean Intellectual Property Office, the disclosure of which is incorporated by reference herein in its entirety.

BACKGROUND

The inventive concepts relate to memory devices and data storage systems. More particularly, the inventive concepts relate to nonvolatile memory devices and data storage systems including the same.

Nonvolatile memory devices are becoming more highly integrated. To achieve higher integration, a planar area of a nonvolatile memory device may be reduced. Therefore, a nonvolatile memory device including a plurality of structures stacked is proposed, the plurality of structures being directly bonded to each other.

SUMMARY

The inventive concepts provide nonvolatile memory devices having an increased degree of design freedom and data storage systems including the same.

According to an embodiment of the inventive concepts, there is provided a nonvolatile memory device including: a first structure including at least one first memory plane; and a second structure bonded to the first structure and including at least one second memory plane, wherein the number of the at least one first memory plane included in the first structure is different from the number of the at least one second memory plane included in the second structure.

According to another embodiment of the inventive concepts, there is provided a nonvolatile memory device including: a first structure; and a second structure on the first structure, wherein the first structure includes: at least one first memory plane; and a plurality of first bonding pads on a first surface of the first structure and connected to the at least one first memory plane, the second structure includes: at least one second memory plane; and a plurality of second bonding pads on a second surface of the second structure and connected to the at least one second memory plane, the plurality of first bonding pads are in contact with the plurality of second bonding pads, respectively, and the number of the at least one first memory plane included in the first structure is different from the number of the at least one second memory plane included in the second structure.

According to another embodiment of the inventive concepts, there is provided a data storage system including: a nonvolatile memory device including a first structure and a second structure bonded to the first structure; and a memory controller electrically connected to the nonvolatile memory device and configured to control the nonvolatile memory device, wherein the first structure includes at least one first memory plane, the second structure includes at least one second memory plane, and the number of the at least one first memory plane included in the first structure is different from the number of the at least one second memory plane included in the second structure.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
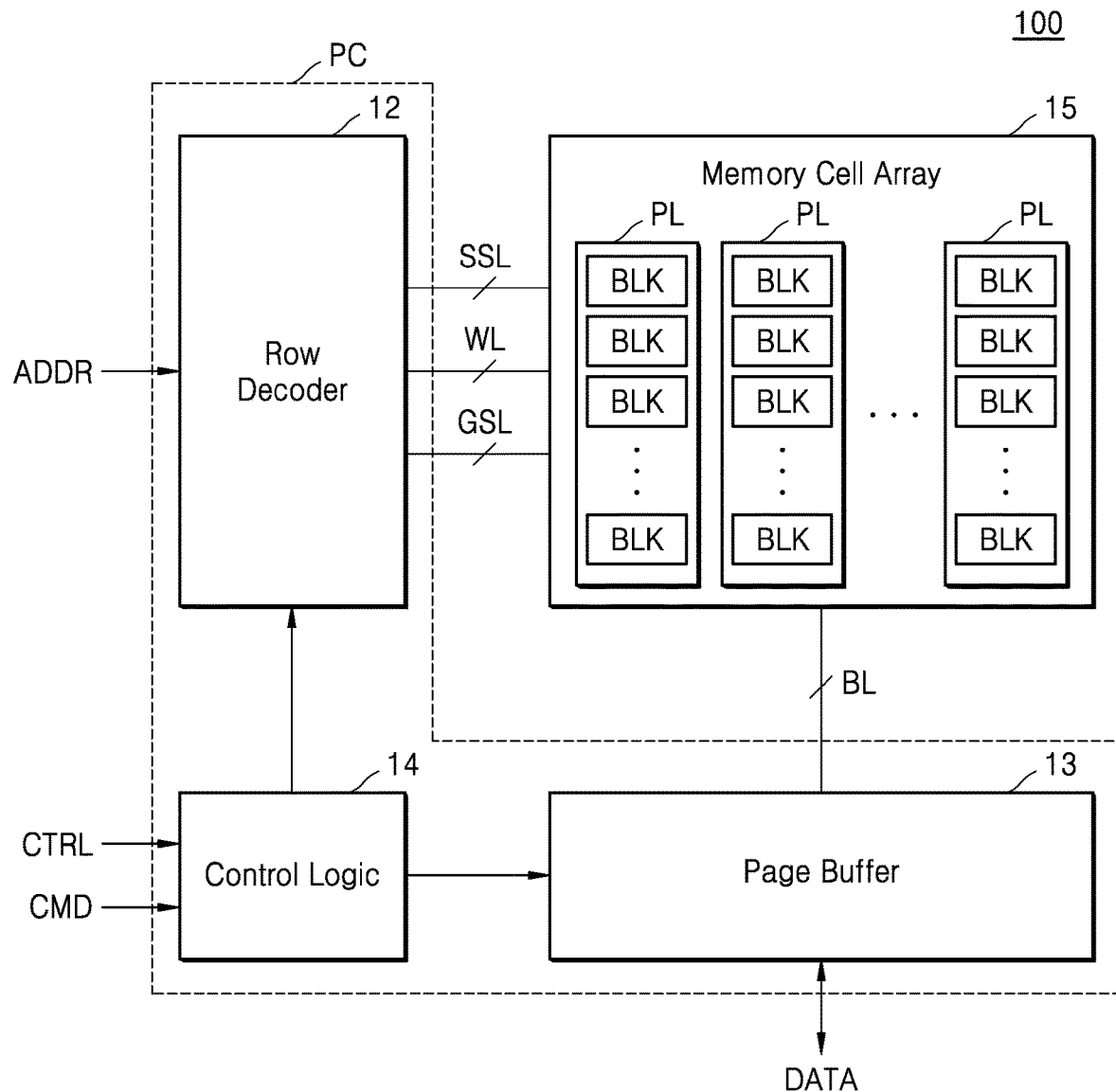
FIG. 1 is a block diagram of a nonvolatile memory device according to an embodiment of the inventive concepts.

FIG. 1 is a block diagram of a nonvolatile memory device 100 according to an embodiment of the inventive concepts.

Referring to FIG. 1, the nonvolatile memory device 100 may maintain data stored therein even when power being supplied is cut off. For example, the nonvolatile memory device 100 may include electrically erasable programmable read-only memory (EEPROM), flash memory, phase change random access memory (PRAM), resistance random access memory (RRAM), magnetic random access memory (MRAM), ferroelectric random access memory (FRAM), or a combination thereof. Hereinafter, embodiments of the inventive concepts will be described in detail under the assumption that the nonvolatile memory device 100 is a three-dimensional NAND flash memory device.

The nonvolatile memory device 100 may include a memory cell array 15 and a peripheral circuit PC. The memory cell array 15 may include a plurality of planes PL (also referred to as a memory plane PL). A plane PL may be a minimum unit on which an operation, e.g., a read, write, or delete operation, is independently performed. When the memory cell array 15 includes the plurality of planes PL, a plurality of operations may be respectively performed on the plurality of planes PL at the same time. Each plane PL may include a plurality of blocks BLK. Each block BLK may be a minimum unit on which a delete operation is performed. Each block BLK may include a plurality of pages. Each page may be a minimum unit for read and write operations. Each page may include a plurality of memory cells in which data is stored.

The peripheral circuit PC may include a row decoder 12, a page buffer 13, and a control logic 14. The row decoder 12 may be connected to the memory cell array 15 through a plurality of string select lines SSL, a plurality of word lines WL, and a plurality of ground select lines GSL. The row decoder 12 may select at least one of the plurality of blocks BLK in the memory cell array 15 in response to an address ADDR provided from a memory controller (not shown). In addition, the row decoder 12 may select at least one of the word lines WL, string select lines SSL, and ground select lines GSL in the selected block BLK in response to the address ADDR provided from the memory controller (not shown).

The page buffer 13 may be connected to the memory cell array 15 through a plurality of bit lines BL. The page buffer 13 may select at least one of the plurality of bit lines BL. The page buffer 13 may store, in the memory cell array 15, data DATA received from the memory controller (not shown). In addition, the page buffer 13 may output, to the memory controller (not shown), the data DATA read from the memory cell array 15.

The control logic 14 may control a general operation of the nonvolatile memory device 100. Particularly, the control logic 14 may control operations of the row decoder 12 and the page buffer 13. For example, the control logic 14 may control the nonvolatile memory device 100 so that a memory operation corresponding to a command CMD provided from the memory controller (not shown) is performed. In addition, the control logic 14 may generate various internal control signals to be used in the nonvolatile memory device 100, in response to a control signal CTRL provided from the memory controller (not shown).

Figure 2:
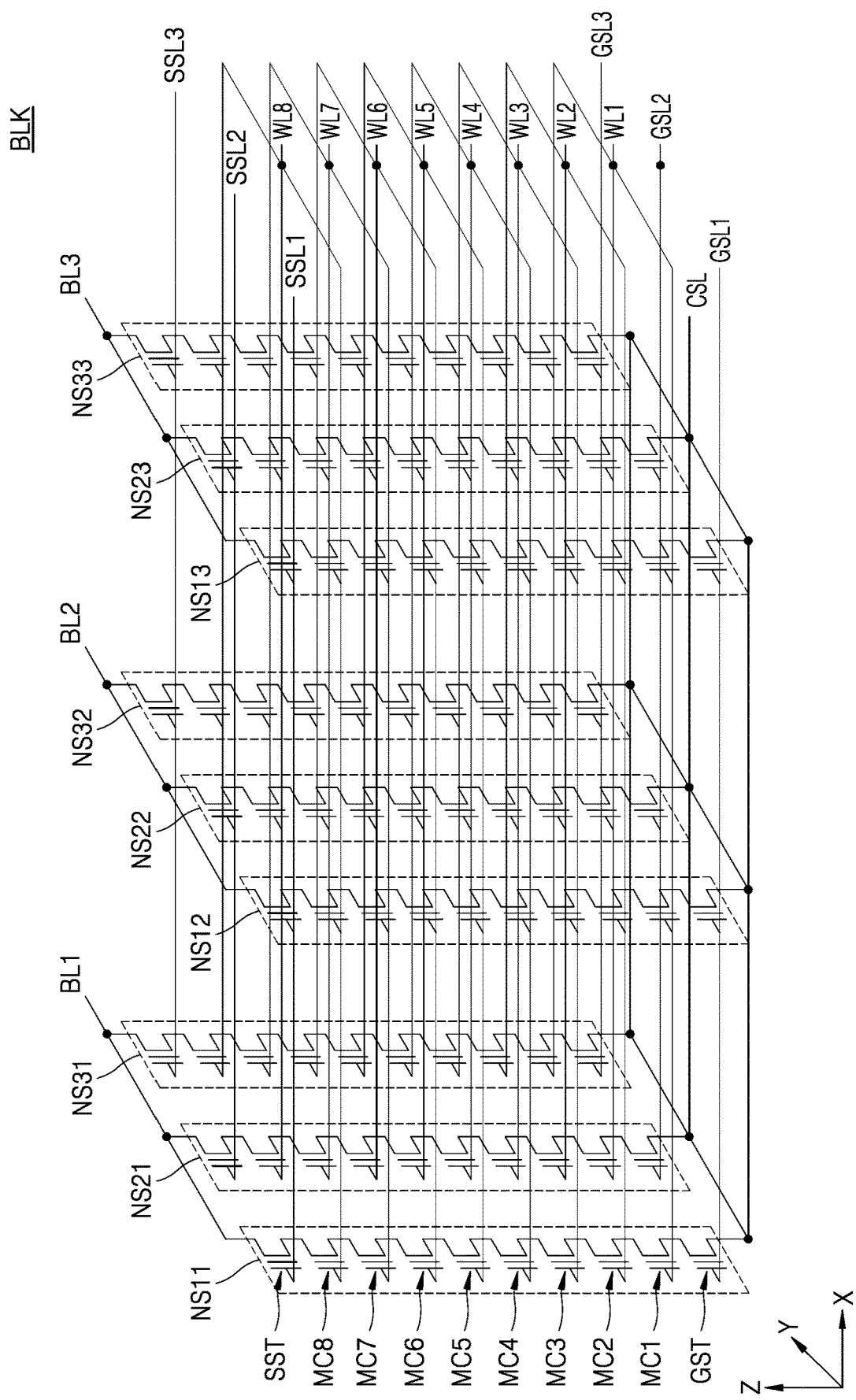
FIG. 2 is a circuit diagram of a block included in a nonvolatile memory device, according to an embodiment of the inventive concepts.

FIG. 2 is a circuit diagram of a block BLK included in a nonvolatile memory device, according to an embodiment of the inventive concepts.

Referring to FIG. 2, the block BLK may include a plurality of NAND strings NS11 to NS33. Although FIG. 2 shows that one block BLK includes nine NAND strings NS11 to NS33, the number of NAND strings included in one block BLK is not limited thereto. Each of the NAND strings NS11 to NS33 may extend in a vertical direction (a Z direction). Each of the NAND strings NS11 to NS33 may include at least one string select transistor SST, a plurality of memory cells MC1 to MC8, and at least one ground select transistor GST, which are connected in series. Although FIG. 2 shows that each of the NAND strings NS11 to NS33 includes one string select transistor SST, eight memory cells MC1 to MC8, and one ground select transistor GST, the numbers of string select transistors, memory cells, and ground select transistors included in one of the NAND strings NS11 to NS33 are not limited thereto.

In some embodiments, each of the NAND strings NS11 to NS33 may further include a dummy memory cell (not shown) between the at least one ground select transistor GST and a first memory cell MC1. In some embodiments, each of the NAND strings NS11 to NS33 may further include a dummy memory cell (not shown) between an eighth memory cell MC8 and the at least one string select transistor SST. It will be understood that, although the terms first, second, third, etc. may be used herein to describe various elements, the elements should not be limited by these terms; rather, these terms are only used to distinguish one element from another element. Thus, a first element discussed below could be termed a second element without departing from the scope of the inventive concepts.

The NAND strings NS11 to NS33 may be connected between bit lines BL1 to BL3 and a common source line CSL. Each of the bit lines BL1 to BL3 may extend in a second horizontal direction (a Y direction). Gates of string select transistors SST may be connected to string select lines SSL1 to SSL3, gates of the memory cells MC1 to MC8 may be connected to word lines WL1 to WL8, and gates of ground select transistors GST may be connected to ground select lines GSL1 to GSL3. Each of the string select lines SSL1 to SSL3, each of the word lines WL1 to WL8, and each of the ground select lines GSL1 to GSL3 may extend in a first horizontal direction (an X direction). The common source line CSL may be commonly connected to the plurality of NAND strings NS11 to NS33. In addition, the word lines WL1 to WL8 may be commonly connected to the plurality of NAND strings NS11 to NS33.

Each of the memory cells MC1 to MC8 may store one-bit data or two- or more-bit data. A memory cell in which one-bit data is stored in one memory cell is called a single level cell (SLC) or a single bit cell. A memory cell in which two- or more-bit data is stored in one memory cell is called a multi-level cell (MLC) or a multi-bit cell.

One plane may include a plurality of blocks BLK sharing the bit lines BL1 to BL3. That is, one plane may include a plurality of blocks BLK arranged in the Y direction in FIG. 2. One block BLK may include a plurality of pages. One page may be a set of memory cells connected to the same word line. For example, nine first memory cells MC1 at the same height in the Z direction in FIG. 2 may form one page.

Figure 3:
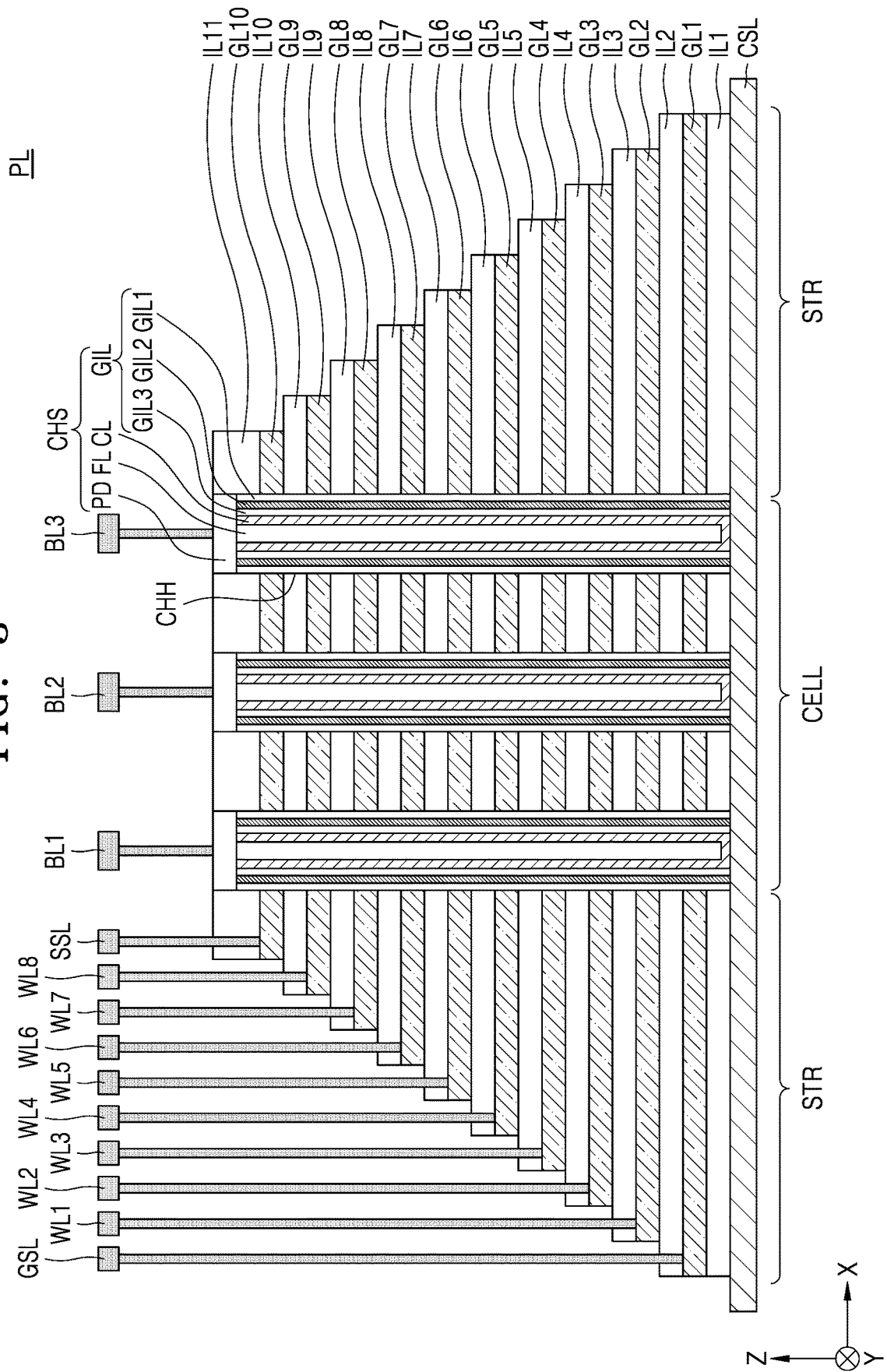
FIG. 3 is a cross-sectional view of a plane included in a nonvolatile memory device, according to an embodiment of the inventive concepts.

FIG. 3 is a cross-sectional view of a plane PL included in a nonvolatile memory device, according to an embodiment of the inventive concepts.

Referring to FIG. 3, the plane PL may include a plurality of interlayer insulating layers IL1 to IL11 and a plurality of gate layers GL1 to GL10, which are alternately stacked, and a plurality of channel structures CHS, each passing through the plurality of interlayer insulating layers IL1 to IL11 and the plurality of gate layers GL1 to GL10. One channel structure CHS and the plurality of gate layers GL1 to GL10 may form one of the plurality of NAND strings NS11 to NS33 shown in FIG. 2. For example, a first gate layer GL1 and one channel structure CHS may form the ground select transistor GST shown in FIG. 2, second through ninth gate layers GL2 to GL9 and one channel structure CHS may form the first through eighth memory cells MC1 to MC8 shown in FIG. 2, and a tenth gate layer GL10 and one channel structure CHS may form the string select transistor SST shown in FIG. 2.

The plurality of gate layers GL1 to GL10 may be connected to a ground select line GSL, a plurality of word lines WL1 to WL8, and a string select line SSL, respectively. Tops of the plurality of channel structures CHS may be connected to a plurality of bit lines BL1 to BL3, respectively. Bottoms of the plurality of channel structures CHS may be connected to the common source line CSL.

The plurality of interlayer insulating layers IL1 to IL11 and the plurality of gate layers GL1 to GL10 may have a stair shape. That is, a planar area of a higher interlayer insulating layer (e.g., IL8) in the Z direction may be less than a planar area of a lower interlayer insulating layer (e.g., IL7) in the Z direction, and a planar area of a higher gate layer (e.g., GL8) in the Z direction may be less than a planar area of a lower gate layer (e.g., GL7) in the Z direction. In the specification, a planar area indicates an area of an X-Y plane. In some embodiments, the stair shape may be constructed such that an outer edge of a lower interlayer insulating layer (e.g., IL7) in the Z direction may extend laterally (e.g., in the X and/or Y direction) beyond an outer edge of a higher interlayer insulating layer (e.g., IL8) in the Z direction, and an outer edge of a lower gate layer (e.g., GL7) in the Z direction may extend laterally (e.g., in the X and/or Y direction) beyond an outer edge of a higher gate layer (e.g., GL8) in the Z direction In FIG. 3, the plurality of interlayer insulating layers IL1 to IL11 and the plurality of gate layers GL1 to GL10 may be depicted to have a stair shape descending in a −Z direction.

The plurality of interlayer insulating layers IL1 to IL11 may include an insulating material including a silicon oxide, a silicon nitride, a low dielectric (low-k) material, or a combination thereof. The low dielectric material is a material having a lower dielectric constant than a silicon oxide and may include, for example, phosphosilicate glass (PSG), borophosphosilicate glass (BPSG), fluorosilicate glass (FSG), organosilicate glass (OSG), spin-on-glass (SOG), a spin-on-polymer, or a combination thereof.

The plurality of gate layers GL1 to GL10 may be separated from each other by the plurality of interlayer insulating layers IL1 to IL11. The plurality of gate layers GL1 to GL10 may include tungsten (W), copper (Cu), silver (Ag), gold (Au), aluminum (Al), a combination thereof, or a conductive material, without being limited thereto. In some embodiments, each of the plurality of gate layers GL1 to GL10 may further include titanium (Ti), tantalum (Ta), titanium nitride (TiN), tantalum nitride (TaN), a combination thereof, or a barrier material, without being limited thereto, to prevent diffusion of the conductive material to the inside of the plurality of interlayer insulating layers IL1 to IL11.

A channel structure CHS may be located inside a channel hole CHH passing through the plurality of gate layers GL1 to GL10 and the plurality of interlayer insulating layers IL1 to IL11 in the vertical direction (e.g., the Z direction). The channel structure CHS may include a gate insulating layer GIL on a side surface of the channel hole CHH, a channel layer CL on the gate insulating layer GIL, a filling insulating layer FL on the channel layer CL, and a channel pad PD within and/or filling an end of the channel hole CHH.

The gate insulating layer GIL may include a blocking insulating layer GIL1, a charge storage layer GIL2, and a tunneling insulating layer GIL3, which are sequentially stacked on the channel hole CHH. The blocking insulating layer GIL1 may include, for example, a silicon oxide, a silicon nitride, a metal oxide having a greater permittivity than the silicon oxide, or a combination thereof. The metal oxide may include, for example, a hafnium oxide, an aluminum oxide, a zirconium oxide, a tantalum oxide, or a combination thereof. The charge storage layer GIL2 may include, for example, a silicon nitride, a boron nitride, polysilicon, or a combination thereof. The tunneling insulating layer GIL3 may include, for example, a metal oxide and/or a silicon oxide. In some embodiments, the blocking insulating layer GIL1, the charge storage layer GIL2, and the tunneling insulating layer GIL3 may include, for example, an oxide, a nitride, and/or an oxide, respectively.

The channel layer CL may be on and/or surround a side surface and one end of the filling insulating layer FL. The channel layer CL may include a semiconductor material such as, for example, a IV group semiconductor material, a III-V group semiconductor material, or a II-VI group semiconductor material. The IV group semiconductor material may include, for example, silicon (Si), germanium (Ge), or Si—Ge. The III-V group semiconductor material may include, for example, gallium arsenide (GaAs), indium phosphide (InP), gallium phosphide (GaP), indium arsenide (InAs), indium antimonide (InSb), or indium gallium arsenide (InGaAs). The II-VI group semiconductor material may include, for example, zinc telluride (ZnTe) or cadmium sulfide (CdS). In some embodiments, the channel layer CL may include polysilicon.

The filling insulating layer FL may be within and/or fill a space surrounded by the channel layer CL and the channel pad PD. The filling insulating layer FL may include an insulating material including, for example, a silicon nitride, a silicon oxide, a low dielectric material, or a combination thereof.

The channel pad PD may be in contact with the gate insulating layer GIL, the channel layer CL, and the filling insulating layer FL. In some embodiments, the gate insulating layer GIL may further extend between the channel pad PD and the channel hole CHH. In some embodiments, the gate insulating layer GIL and the channel layer CL may further extend between the channel pad PD and the channel hole CHH. In this case, the channel pad PD may be separated from the gate insulating layer GIL by the channel layer CL. The channel pad PD may include a conductive material including, for example, a semiconductor material such as Si, Ge, and/or Si—Ge, a metal material such as W, Ti, Al, Cu, Au, or Ag, a metal nitride such as TiN or TaN, and/or a combination thereof. In some embodiments, the channel pad PD may include polysilicon.

The plane PL may include a cell region CELL in which the plurality of channel structures CHS are located and a stair region STR having a stair shape.

The ground select line GSL, the plurality of word lines WL1 to WL8, the string select line SSL, and the plurality of bit lines BL1 to BL3 may connect the plane PL to the peripheral circuit PC (see FIG. 1). The ground select line GSL, the plurality of word lines WL1 to WL8, the string select line SSL, and the plurality of bit lines BL1 to BL3 may include a conductive material such as, for example, Cu, Al, W, Ag, and/or Au. In some embodiments, the ground select line GSL, the plurality of word lines WL1 to WL8, the string select line SSL, and the plurality of bit lines BL1 to BL3 may further include a barrier material such as, for example, Ti, Ta, TiN, and/or TaN.

The common source line CSL may include a semiconductor material such as, for example, a IV group semiconductor material, a III-V group semiconductor material, or a II-VI group semiconductor material. In some embodiments, the common source line CSL may be a portion of a Si epitaxial layer or a portion of a Si wafer.

Figure 4A:
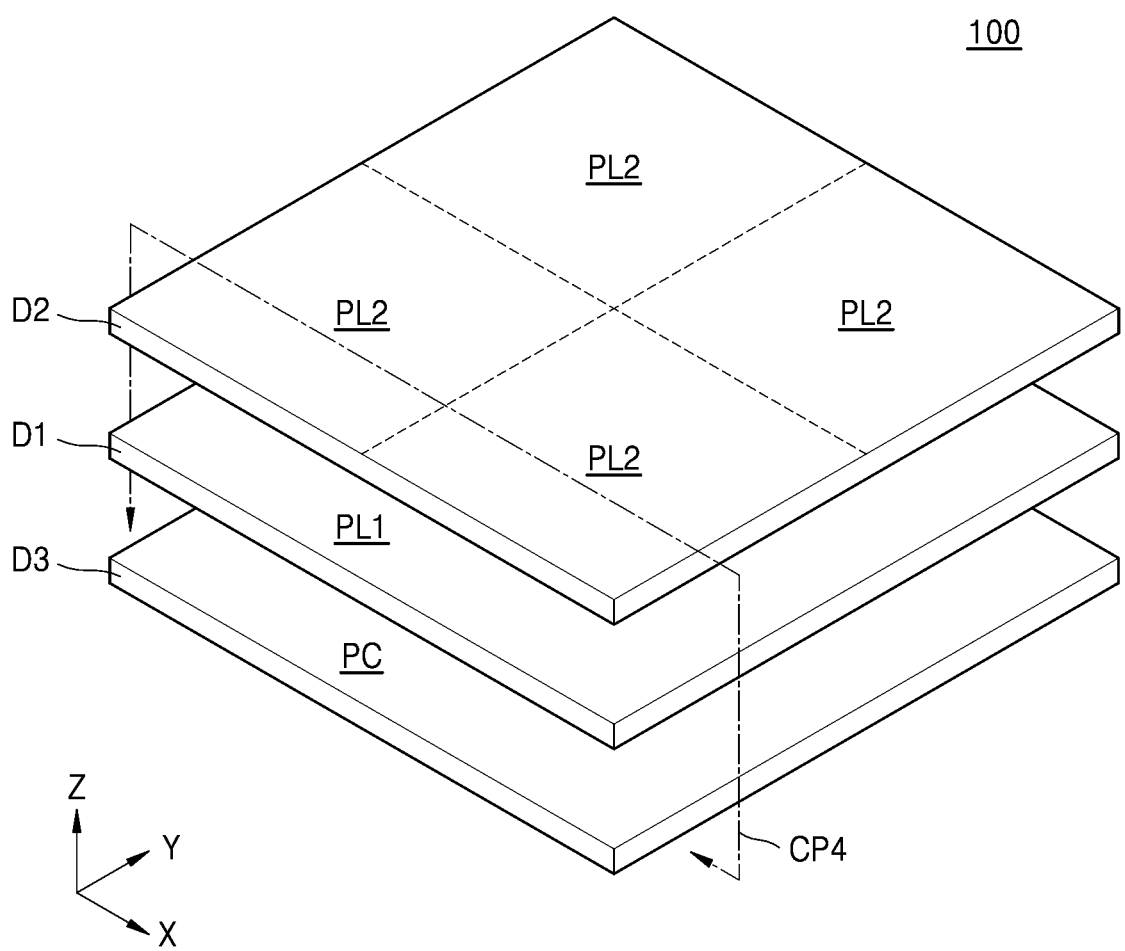
FIG. 4A is an exploded perspective view of a nonvolatile memory device according to an embodiment of the inventive concepts.
Figure 4B:
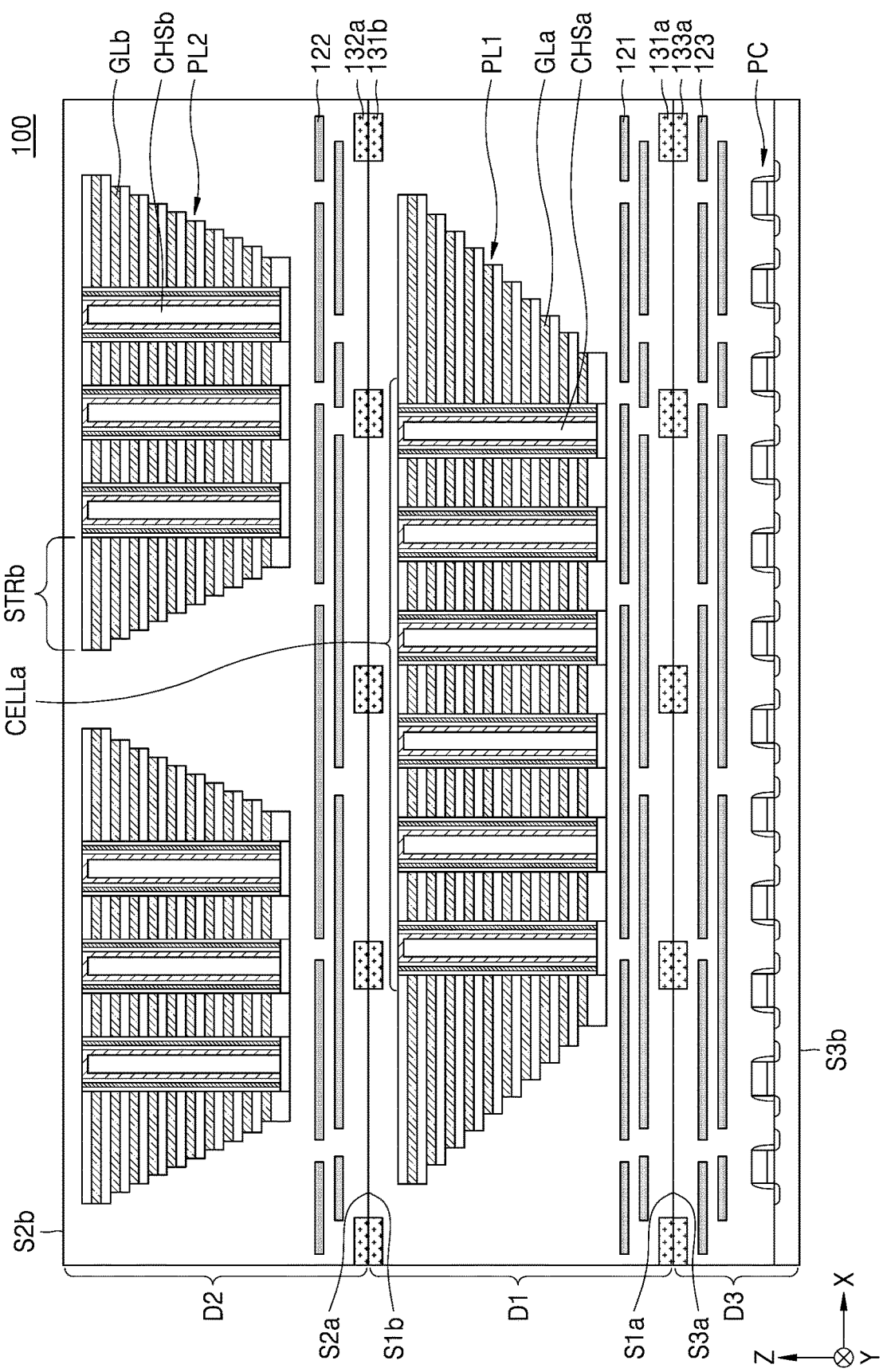
FIG. 4B is a cross-sectional view of the nonvolatile memory device of FIG. 4A along a surface CP4, according to an embodiment of the inventive concepts.

FIG. 4A is an exploded perspective view of the nonvolatile memory device 100 according to an embodiment of the inventive concepts. FIG. 4B is a cross-sectional view of the nonvolatile memory device 100 of FIG. 4A along a surface CP4, according to an embodiment of the inventive concepts.

Referring to FIGS. 4A and 4B, the nonvolatile memory device 100 may include a first structure D1, a second structure D2 on the first structure D1, and a third structure D3 beneath the first structure D1 (e.g., such that the first structure D1 is between the second structure D2 and the third structure D3). In the embodiment shown in FIGS. 4A and 4B, the first structure D1, the second structure D2, and the third structure D3 may have the same planar area. However, in another embodiment, unlike that shown in FIGS. 4A and 4B, at least two of the first structure D1, the second structure D2, and the third structure D3 may have different planar areas.

The first structure D1 may include at least one first plane PL1, the second structure D2 may include at least one second plane PL2, and the third structure D3 may include the peripheral circuit PC. The peripheral circuit PC may include a plurality of transistors. Although FIG. 4A shows that the first structure D1 includes one first plane PL1 and the second structure D2 includes four second planes PL2, the number (e.g., the quantity) of first planes PL1 included in the first structure D1 and the number (e.g., the quantity) of second planes PL2 included in the second structure D2 are not limited thereto. FIG. 4A shows that the four second planes PL2 are arranged as a 2×2 matrix, but in another embodiment, the four second planes PL2 may be arranged as a 4×1 matrix or a 1×4 matrix.

The number (e.g., 1 in FIG. 4A) of first planes PL1 included in the first structure D1 may be different from the number (e.g., 4 in FIG. 4A) of second planes PL2 included in the second structure D2. For example, the number (e.g., 4 in FIG. 4A) of second planes PL2 included in the second structure D2 may be an even number times the number (e.g., 1 in FIG. 4A) of first planes PL1 included in the first structure D1. In general, the more the number of planes included in a structure, the better the performance of the structure, but the worse a yield of the structure. For example, the number of first planes PL1 included in the first structure D1 may be less than the number of second planes PL2 included in the second structure D2 so that a yield of the first structure D1 is improved and the performance of the second structure D2 is improved. As described above, by independently designing the number of first planes PL1 included in the first structure D1 and the number of second planes PL2 included in the second structure D2, a degree of design freedom may increase.

FIG. 4A shows that the first structure D1 includes only one first plane PL1, but in another embodiment, the first structure D1 may include a plurality of first planes PL1. In addition, FIG. 4A shows that the number (e.g., 1 in FIG. 4A) of first planes PL1 included in the first structure D1 is less than the number (e.g., 4 in FIG. 4A) of second planes PL2 included in the second structure D2, but in another embodiment, the number of first planes PL1 included in the first structure D1 may be greater than the number of second planes PL2 included in the second structure D2.

The first structure D1 may have a first surface S1a and a second surface S1b on opposite sides of the first structure D1 with respect to each other, the second structure D2 may have a first surface S2a and a second surface S2b on opposite sides of the second structure D2 with respect to each other, and the third structure D3 may have a first surface S3a and a second surface S3b on opposite sides of the third structure D3 with respect to each other. The first surface S1a of the first structure D1 may be bonded to the first surface S3a of the third structure D3, and the second surface S1b of the first structure D1 may be bonded to the first surface S2a of the second structure D2. The first structure D1 may be bonded to the second structure D2 without wires or bumps for connecting between the first structure D1 and the second structure D2. That is, the first structure D1 may be directly bonded to the second structure D2. Likewise, the first structure D1 may be directly bonded to the third structure D3.

The first structure D1 may further include a plurality of first bonding pads 131a on the first surface S1a of the first structure D1 and a plurality of second bonding pads 131b on the second surface S1b of the first structure D1. The second structure D2 may further include a plurality of first bonding pads 132a on the first surface S2a of the second structure D2. The third structure D3 may further include a plurality of first bonding pads 133a on the first surface S3a of the third structure D3. The first structure D1 and the third structure D3 may be physically and electrically connected to each other by direct bonding between the plurality of first bonding pads 131a of the first structure D1 and the plurality of first bonding pads 133a of the third structure D3. In addition, the first structure D1 and the second structure D2 may be physically and electrically connected to each other by direct bonding between the plurality of second bonding pads 131b of the first structure D1 and the plurality of first bonding pads 132a of the second structure D2.

The plurality of first bonding pads 131a and the plurality of second bonding pads 131b of the first structure D1, the plurality of first bonding pads 132a of the second structure D2, and the plurality of first bonding pads 133a of the third structure D3 may include a conductive material including, for example, Cu, Au, Ag, Al, W, Ti, Ta, or a combination thereof. In some embodiments, the plurality of first bonding pads 131a and the plurality of second bonding pads 131b of the first structure D1, the plurality of first bonding pads 132a of the second structure D2, and the plurality of first bonding pads 133a of the third structure D3 may include Cu, and Cu—Cu direct bonding may be formed between the first structure D1 and the second structure D2 and between the first structure D1 and the third structure D3. In some embodiments, the plurality of first bonding pads 131a and the plurality of second bonding pads 131b of the first structure D1, the plurality of first bonding pads 132a of the second structure D2, and the plurality of first bonding pads 133a of the third structure D3 may further include a barrier material such as, for example—Ti, Ta, TiN, and/or TaN.

The first structure D1 may further include a first interconnect 121. The first interconnect 121 may connect the at least one first plane PL1 to the plurality of first bonding pads 131a and the plurality of second bonding pads 131b of the first structure D1. Although FIG. 4B shows that the first interconnect 121 includes only a plurality of lines, the first interconnect 121 may further include vias, plugs, through vias passing through the at least one first plane PL1, and the like.

The second structure D2 may further include a second interconnect 122 connecting the at least one second plane PL2 to the plurality of first bonding pads 132a of the second structure D2. Although FIG. 4B shows that the second interconnect 122 includes only a plurality of lines, the second interconnect 122 may further include vias and plugs.

The third structure D3 may further include a third interconnect 123 connecting the peripheral circuit PC to the plurality of first bonding pads 133a of the third structure D3. Although FIG. 4B shows that the third interconnect 123 includes only a plurality of lines, the third interconnect 123 may further include vias and plugs.

The first interconnect 121, the second interconnect 122, and the third interconnect 123 may include a conductive material such as Cu, Al, W, Ag, or Au. In some embodiments, the first interconnect 121, the second interconnect 122, and the third interconnect 123 may further include a barrier material such as, for example, Ti, Ta, TiN, and/or TaN.

In some embodiments, each of the at least one first plane PL1 may have a stair shape descending from the first surface S1a of the first structure D1 toward the second surface S1b of the first structure D1. Each of the at least one second plane PL2 may have a stair shape descending from the first surface S2a of the second structure D2 toward the second surface S2b of the second structure D2. In some embodiments, in a point of a plan view, a cell region CELLa of each of the at least one first plane PL1 may overlap a stair region STRb of each of the at least one second plane PL2. That is, a projection of the cell region CELLa of each of the at least one first plane PL1 onto the X-Y plane may overlap a projection of the stair region STRb of each of the at least one second plane PL2 onto the X-Y plane. In some embodiments, the cell region CELLa of each of the at least one first plane PL1 may vertically overlap the stair region STRb of one or more of the at least one second plane PL2. It will be understood that "an element A vertically overlapping an element B" (or similar language) as used herein means that at least one vertical line intersecting both the elements A and B exists. In some embodiments the third direction D3 may be perpendicular to the second direction D2.

In some embodiments, a planar area of each of the at least one first plane PL1 may be identical. Likewise, a planar area of each of the at least one second plane PL2 may be identical. A planar area of one of the at least one first plane PL1 may be different from a planar area of one of the at least one second plane PL2. For example, the planar area of one first plane PL1 may be around four times the planar area of one second plane PL2.

The number of channel structures CHSa included in one first plane PL1 may be different from the number of channel structures CHSb included in one second plane PL2. For example, in the embodiment of FIGS. 4A and 4B, the number of channel structures CHSa included in one first plane PL1 may be around four times the number of channel structures CHSb included in one second plane PL2. In some embodiments, the number (e.g., 10 in FIG. 4B) of gate layers GLa included in one first plane PL1 may be the same as the number (e.g., 10 in FIG. 4B) of gate layers GLb included in one second plane PL2.

Figure 5:
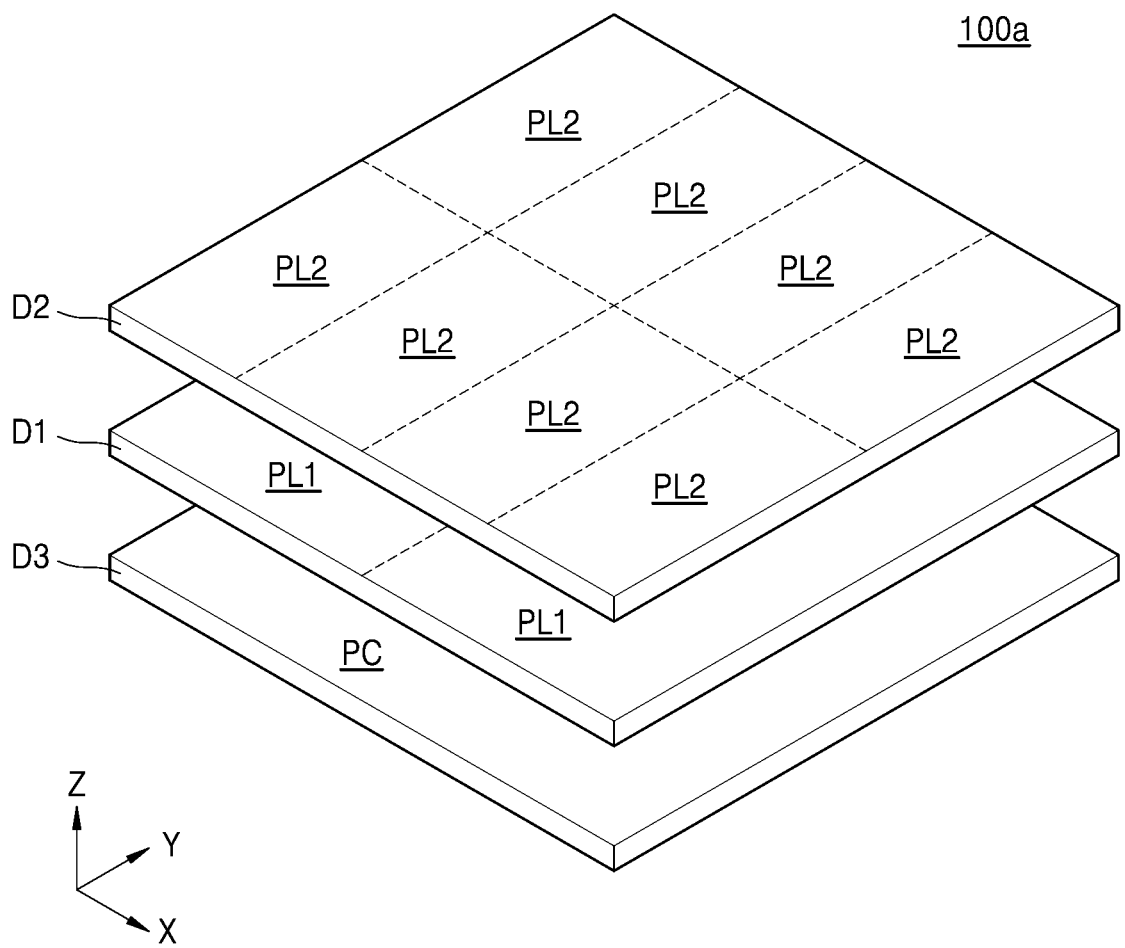
FIG. 5 is an exploded perspective view of a nonvolatile memory device according to an embodiment of the inventive concepts.

FIG. 5 is an exploded perspective view of a nonvolatile memory device 100a according to an embodiment of the inventive concepts. Hereinafter, differences between the nonvolatile memory device 100 shown in FIGS. 4A and 4B and the nonvolatile memory device 100a shown in FIG. 5 will be described.

Referring to FIG. 5, the first structure D1 may include two first planes PL1, and the second structure D2 may include eight second planes PL2. That is, the first structure D1 may also include a plurality of first planes PL1. FIG. 5 shows that the eight second planes PL2 are arranged as a 4×2 matrix, but in another embodiment, the eight second planes PL2 may be arranged in another form such as an 8×1, 2×4, or 1×8 matrix. FIG. 5 also shows that the two first planes PL1 are arranged as a 2×1 matrix, but in another embodiment, the two first planes PL1 may be arranged in another form such as a 1×2 matrix.

Figure 6:
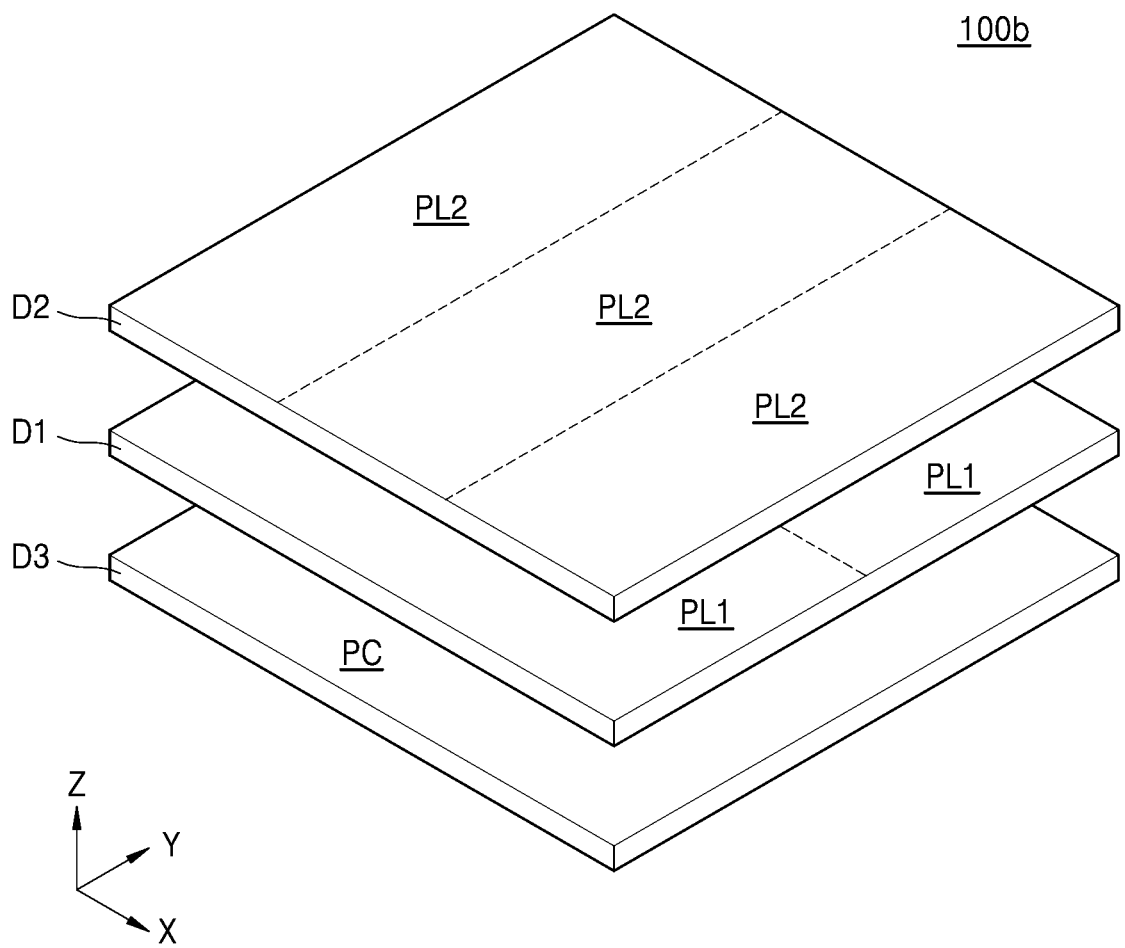
FIG. 6 is an exploded perspective view of a nonvolatile memory device according to an embodiment of the inventive concepts.

FIG. 6 is an exploded perspective view of a nonvolatile memory device 100b according to an embodiment of the inventive concepts. Hereinafter, differences between the nonvolatile memory device 100 shown in FIGS. 4A and 4B and the nonvolatile memory device 100b shown in FIG. 6 will be described.

Referring to FIG. 6, the first structure D1 may include two first planes PL1, and the second structure D2 may include three second planes PL2. That is, the number of first planes PL1 included in the first structure D1 and the number of second planes PL2 included in the second structure D2 do not have to be necessarily even numbers. The two first planes PL1 included in the first structure D1 may be arranged as a 1×2 matrix (as shown in FIG. 6) or a 2×1 matrix. The three second planes PL2 included in the second structure D2 may be arranged as a 1×3 matrix or a 3×1 matrix (as shown in FIG. 6).

Figure 7A:
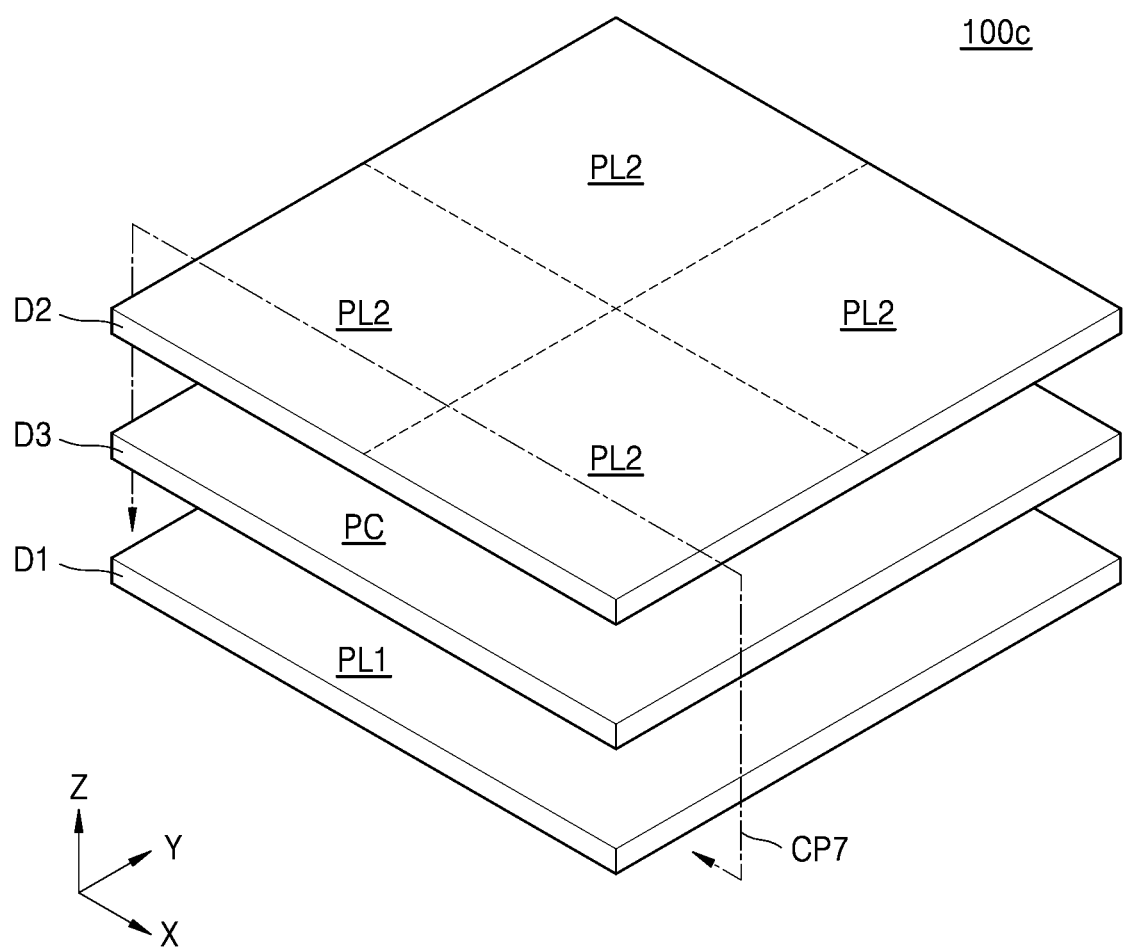
FIG. 7A is an exploded perspective view of a nonvolatile memory device according to an embodiment of the inventive concepts.
Figure 7B:
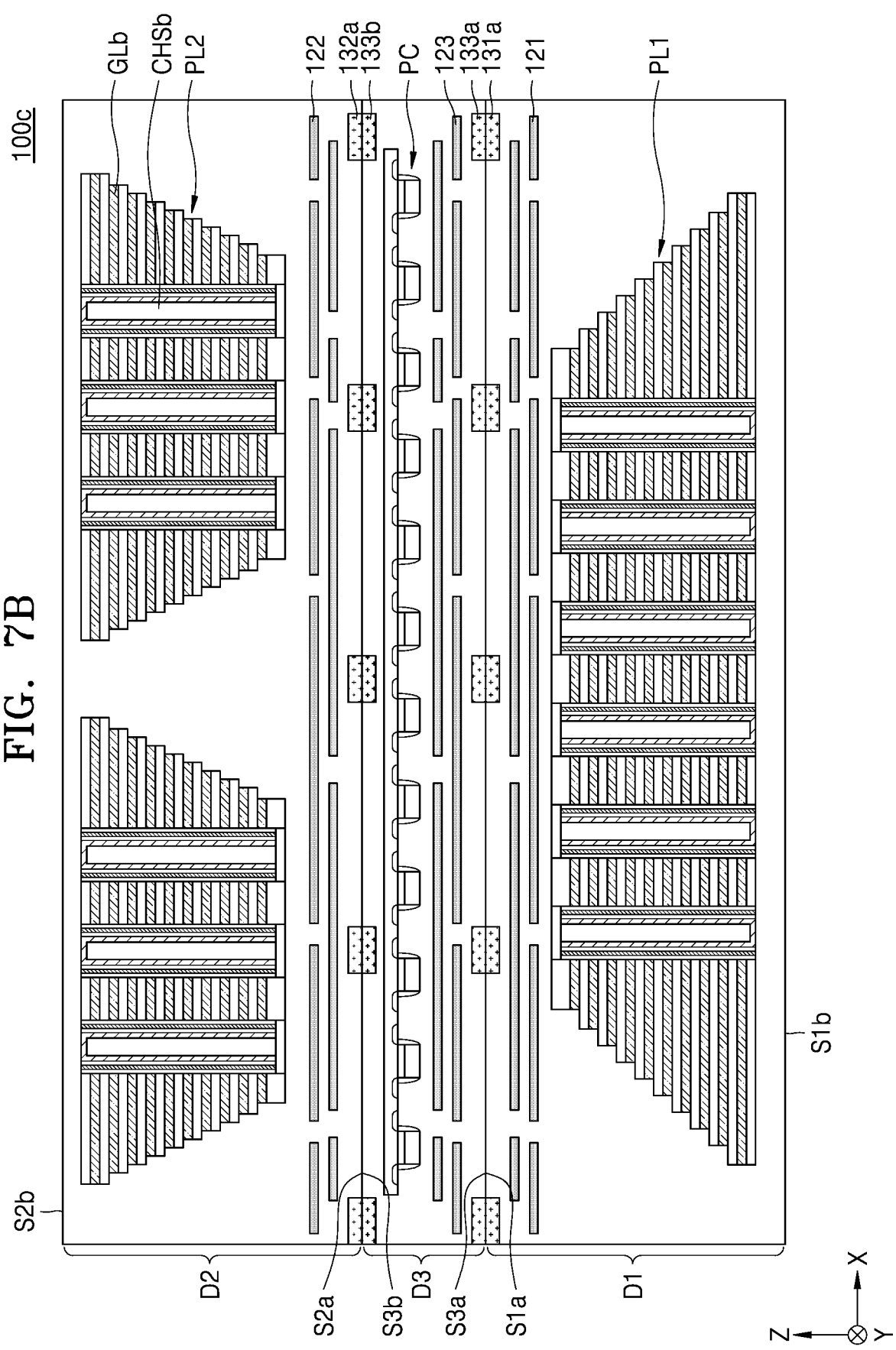
FIG. 7B is a cross-sectional view of the nonvolatile memory device of FIG. 7A along a surface CP7, according to an embodiment of the inventive concepts.

FIG. 7A is an exploded perspective view of a nonvolatile memory device 100c according to an embodiment of the inventive concepts. FIG. 7B is a cross-sectional view of the nonvolatile memory device 100c of FIG. 7A along a surface CP7, according to an embodiment of the inventive concepts; Hereinafter, differences between the nonvolatile memory device 100 shown in FIGS. 4A and 4B and the nonvolatile memory device 100c shown in FIGS. 7A and 7B will be described.

Referring to FIGS. 7A and 7B, the nonvolatile memory device 100c may include the first structure D1, the second structure D2, and the third structure D3 between the first structure D1 and the second structure D2. The first surface S1a of the first structure D1 may be bonded to the first surface S3a of the third structure D3, and a second surface S3b of the third structure D3 may be bonded to the first surface S2a of the second structure D2. The first structure D1 may be directly bonded to the third structure D3, and the second structure D2 may be directly bonded to the third structure D3.

The first structure D1 may include the plurality of first bonding pads 131a on the first surface S1a of the first structure D1. The second structure D2 may include the plurality of first bonding pads 132a on the first surface S2a of the second structure D2. The third structure D3 may include the plurality of first bonding pads 133a on the first surface S3a of the third structure D3 and a plurality of second bonding pads 133b on the second surface S3b of the third structure D3. The first structure D1 and the third structure D3 may be physically and electrically connected to each other by direct bonding between the plurality of first bonding pads 131a of the first structure D1 and the plurality of first bonding pads 133a of the third structure D3. In addition, the third structure D3 and the second structure D2 may be physically and electrically connected to each other by direct bonding between the plurality of second bonding pads 133b of the third structure D3 and the plurality of first bonding pads 132a of the second structure D2.

The first interconnect 121 may connect the at least one first plane PL1 to the plurality of first bonding pads 131a of the first structure D1. The third interconnect 123 may connect the peripheral circuit PC to the plurality of first bonding pads 133a and the plurality of second bonding pads 133b of the third structure D3. The second interconnect 122 may connect the at least one second plane PL2 to the plurality of first bonding pads 132a of the second structure D2.

Figure 8A:
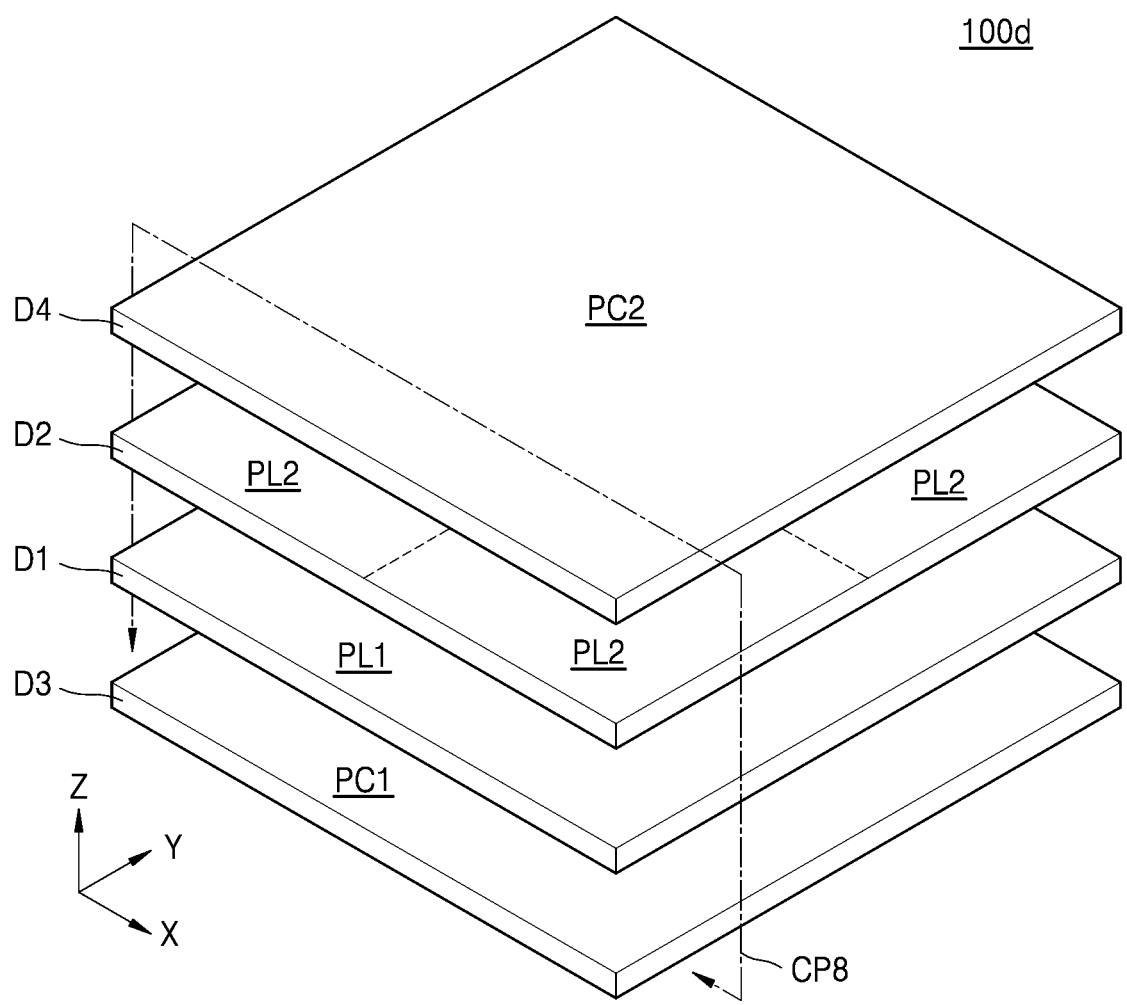
FIG. 8A is an exploded perspective view of a nonvolatile memory device according to an embodiment of the inventive concepts.
Figure 8B:
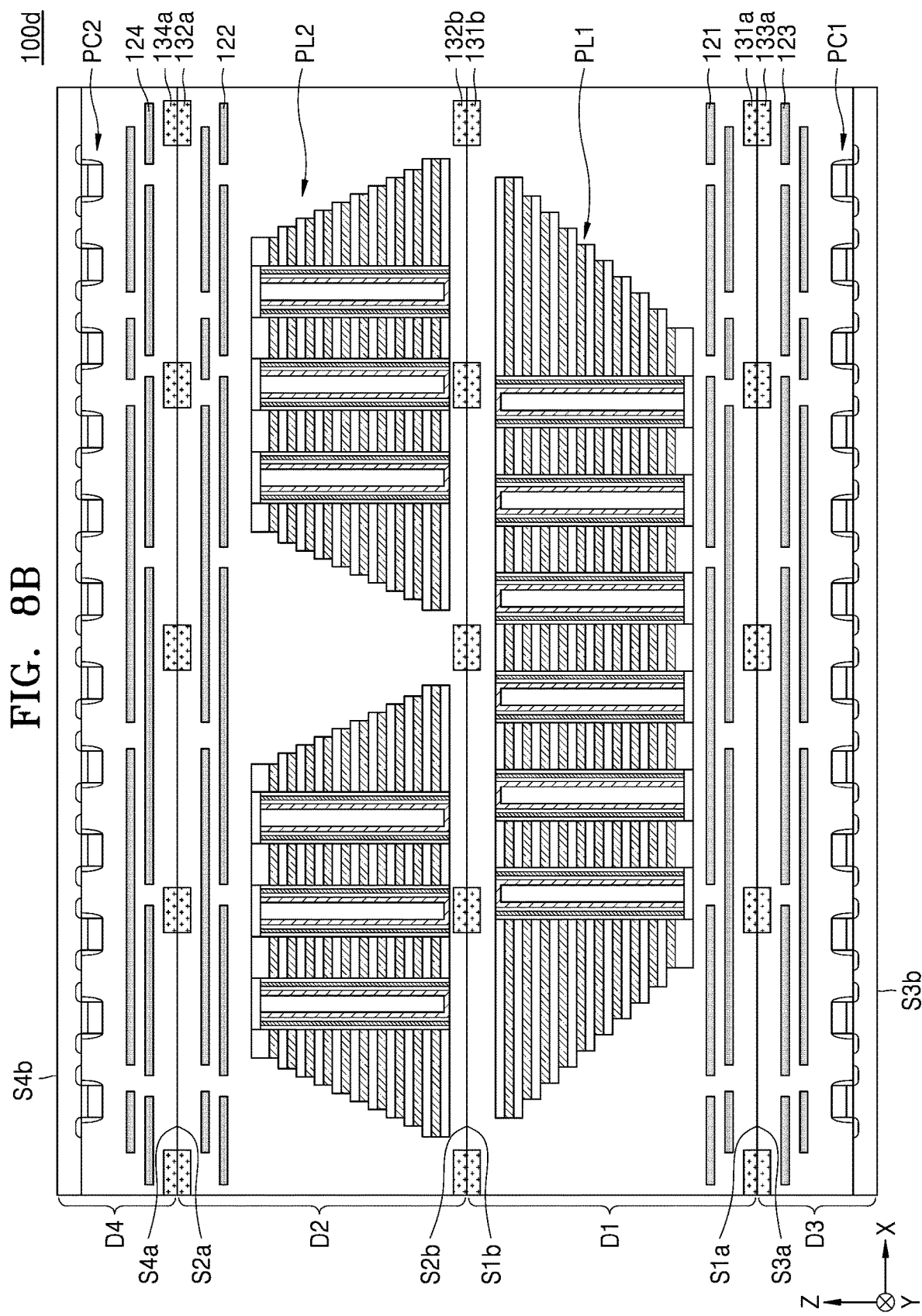
FIG. 8B is a cross-sectional view of the nonvolatile memory device of FIG. 8A along a surface CP8, according to an embodiment of the inventive concepts.

FIG. 8A is an exploded perspective view of a nonvolatile memory device 100d according to an embodiment of the inventive concepts. FIG. 8B is a cross-sectional view of the nonvolatile memory device 100d of FIG. 8A along a surface CP8, according to an embodiment of the inventive concepts. Hereinafter, differences between the nonvolatile memory device 100 shown in FIGS. 4A and 4B and the nonvolatile memory device 100d shown in FIGS. 8A and 8B will be described.

Referring to FIGS. 8A and 8B, the nonvolatile memory device 100d may further include a fourth structure D4 on the second structure D2. The fourth structure D4 may be directly bonded to the second structure D2. The first surface S2a of the second structure D2 may be bonded to a first surface S4a of the fourth structure D4, and the second surface S2b of the second structure D2 may be bonded to the second surface S1b of the first structure D1.

The third structure D3 may include a first peripheral circuit PC1, the first structure D1 may include at least one first plane PL1, the second structure D2 may include at least one second plane PL2, and the fourth structure D4 may include a second peripheral circuit PC2.

The second structure D2 may include the plurality of first bonding pads 132a on the first surface S2a of the second structure D2 and a plurality of second bonding pads 132b on the second surface S2b of the second structure D2. The fourth structure D4 may include a plurality of first bonding pads 134a on the first surface S4a of the fourth structure D4. The second structure D2 and the fourth structure D4 may be physically and electrically connected to each other by direct bonding between the plurality of first bonding pads 132a of the second structure D2 and the plurality of first bonding pads 134a of the fourth structure D4. The second structure D2 and the first structure D1 may be physically and electrically connected to each other by direct bonding between the plurality of second bonding pads 132b of the second structure D2 and the plurality of second bonding pads 131b of the first structure D1.

The first interconnect 121 may connect the at least one first plane PL1 to the plurality of first bonding pads 131a and the plurality of second bonding pads 131b of the first structure D1. The second interconnect 122 may connect the at least one second plane PL2 to the plurality of first bonding pads 132a and the plurality of second bonding pads 132b of the second structure D2. The third interconnect 123 may connect the first peripheral circuit PC1 to the plurality of first bonding pads 133a of the third structure D3. The fourth structure D4 may further include a fourth interconnect 124 connecting the second peripheral circuit PC2 to the plurality of first bonding pads 134a of the fourth structure D4.

Figure 9A:
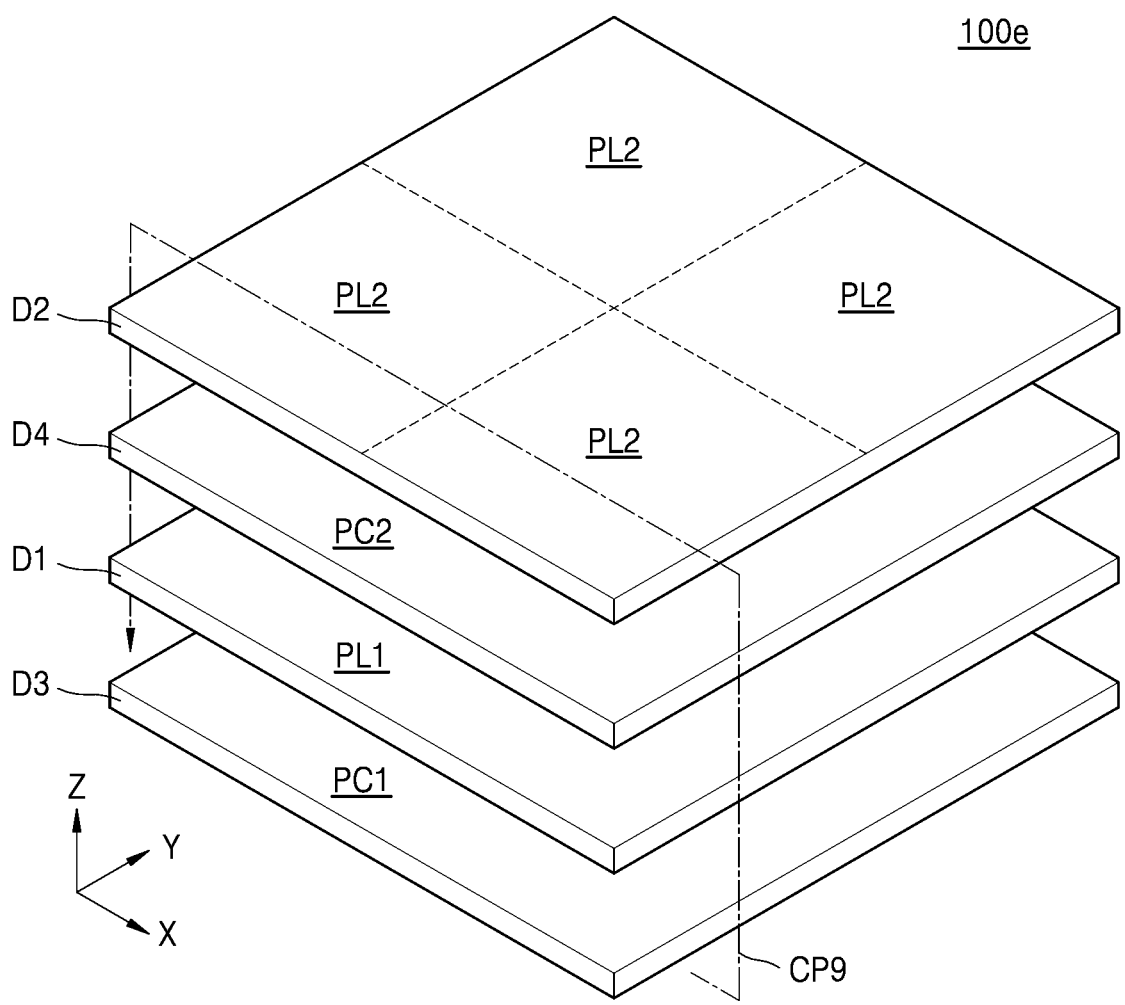
FIG. 9A is an exploded perspective view of a nonvolatile memory device according to an embodiment of the inventive concepts.
Figure 9B:
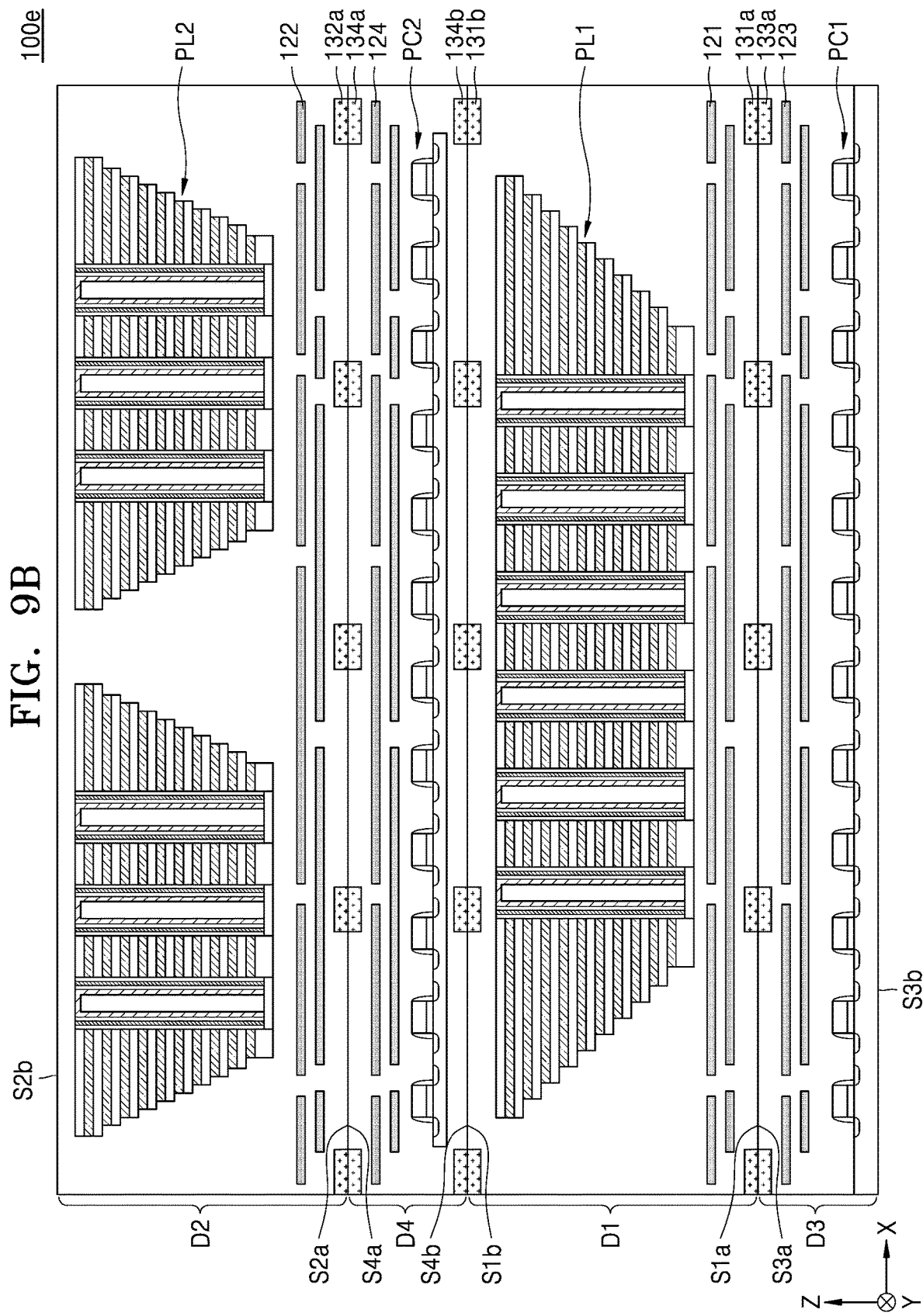
FIG. 9B is a cross-sectional view of the nonvolatile memory device of FIG. 9A along a surface CP9, according to an embodiment of the inventive concepts.

FIG. 9A is an exploded perspective view of a nonvolatile memory device 100e according to an embodiment of the inventive concepts. FIG. 9B is a cross-sectional view of the nonvolatile memory device 100e of FIG. 9A along a surface CP9, according to an embodiment of the inventive concepts. Hereinafter, differences between the nonvolatile memory device 100d shown in FIGS. 8A and 8B and the nonvolatile memory device 100e shown in FIGS. 9A and 9B will be described.

Referring to FIGS. 9A and 9B, the fourth structure D4 may be between the first structure D1 and the second structure D2. That is, the nonvolatile memory device 100e may include the third structure D3, the first structure D1, the fourth structure D4, and the second structure D2, which are stacked in the vertical direction (the Z direction). The first surface S4a of the fourth structure D4 may be bonded to the first surface S2a of the second structure D2, and a second surface S4b of the fourth structure D4 may be bonded to the second surface S1b of the first structure D1. The fourth structure D4 may be directly bonded to the first structure D1 and the second structure D2.

The fourth structure D4 may include the plurality of first bonding pads 134a on the first surface S4a of the fourth structure D4 and a plurality of second bonding pads 134b on the second surface S4b of the fourth structure D4. The fourth structure D4 and the first structure D1 may be physically and electrically connected to each other by direct bonding between the plurality of second bonding pads 134b of the fourth structure D4 and the plurality of second bonding pads 131b of the first structure D1. In addition, the fourth structure D4 and the second structure D2 may be physically and electrically connected to each other by direct bonding between the plurality of first bonding pads 134a of the fourth structure D4 and the plurality of first bonding pads 132a of the second structure D2. The fourth interconnect 124 may connect the second peripheral circuit PC2 to the plurality of first bonding pads 134a and the plurality of second bonding pads 134b of the fourth structure D4.

Figure 10A:
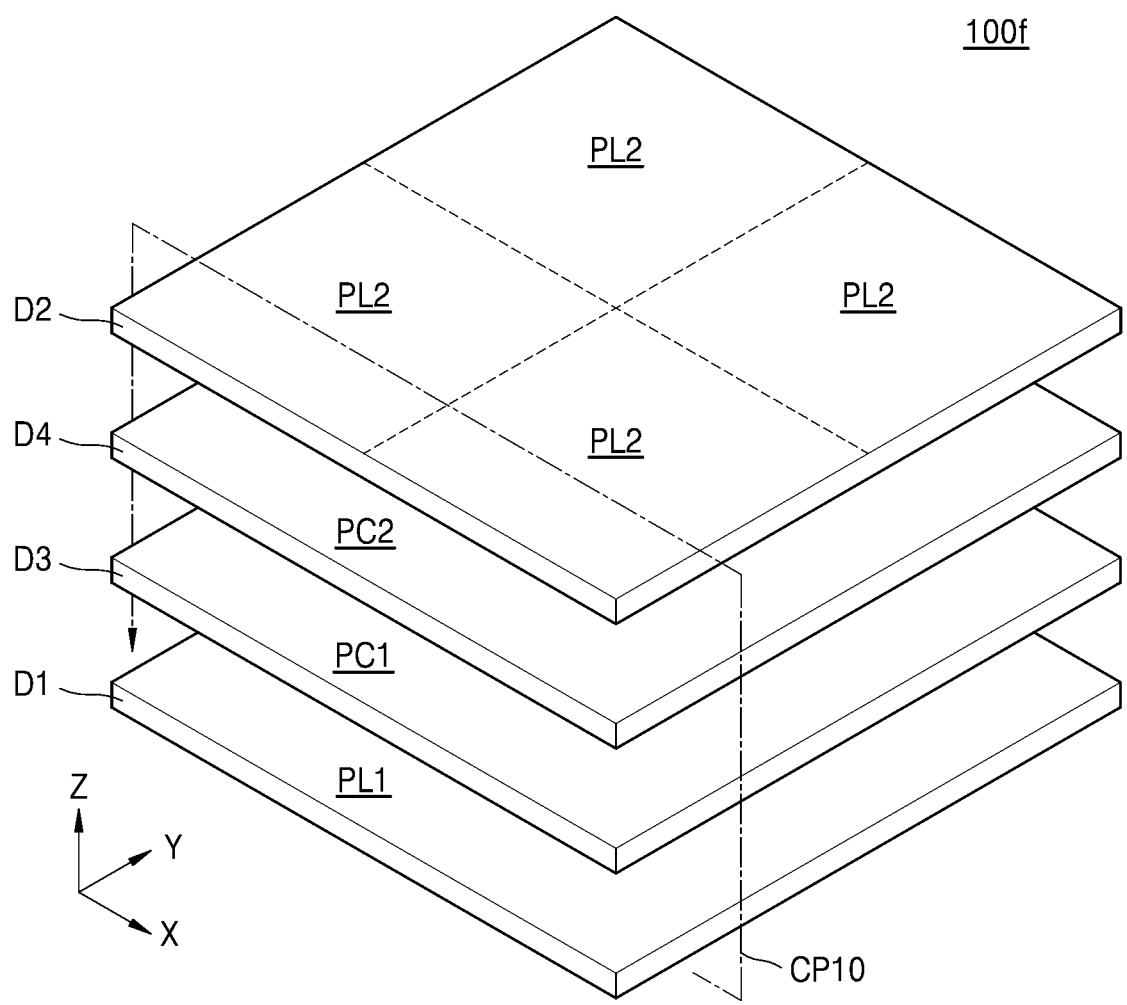
FIG. 10A is an exploded perspective view of a nonvolatile memory device according to an embodiment of the inventive concepts.
Figure 10B:
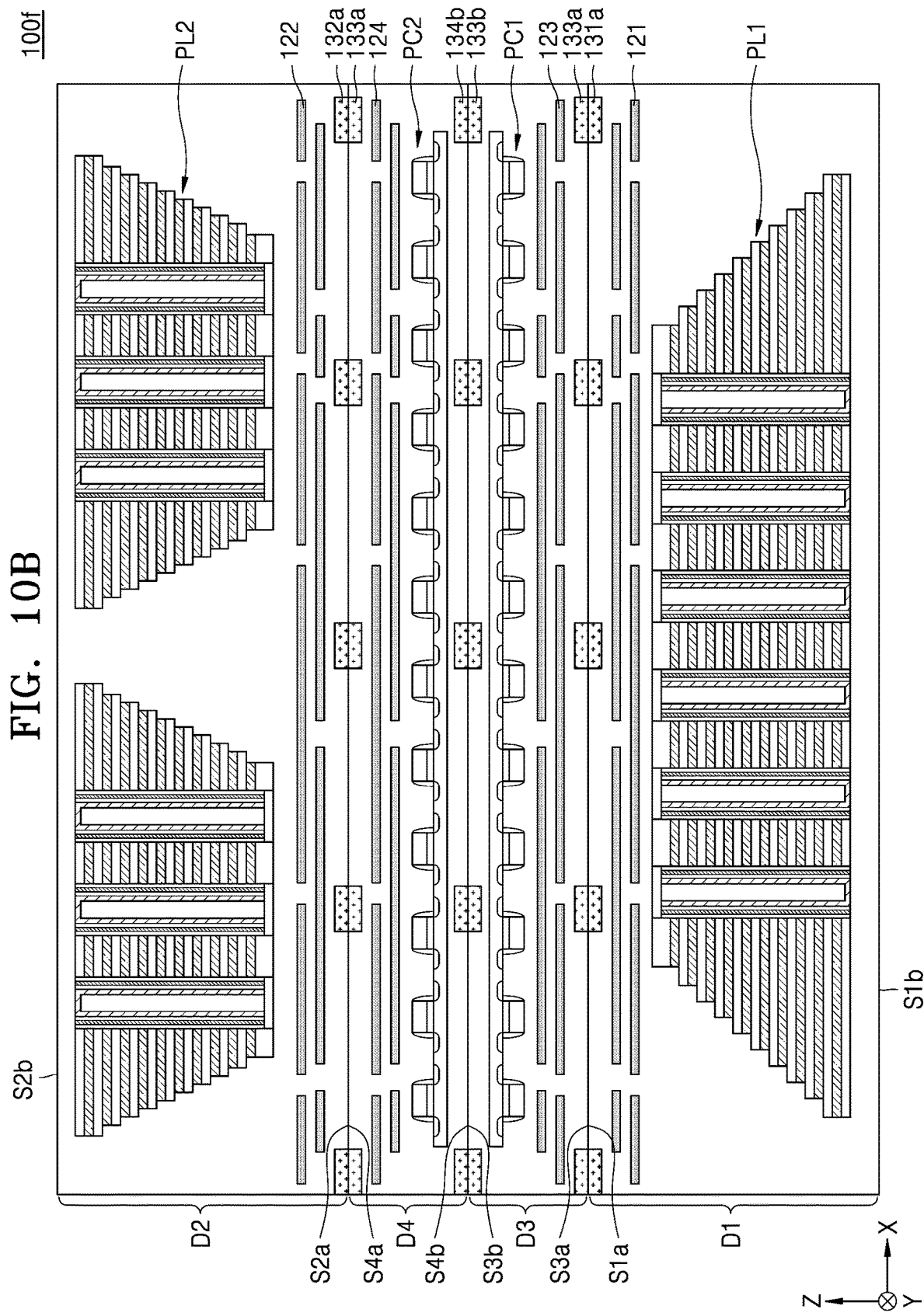
FIG. 10B is a cross-sectional view of the nonvolatile memory device of FIG. 10A along a surface CP10, according to an embodiment of the inventive concepts.

FIG. 10A is an exploded perspective view of a nonvolatile memory device 100f according to an embodiment of the inventive concepts. FIG. 10B is a cross-sectional view of the nonvolatile memory device 100f of FIG. 10A along a surface CP10, according to an embodiment of the inventive concepts. Hereinafter, differences between the nonvolatile memory device 100e shown in FIGS. 9A and 9B and the nonvolatile memory device 100f shown in FIGS. 10A and 10B will be described.

Referring to FIGS. 10A and 10B, the third structure D3 may be between the first structure D1 and the fourth structure D4. That is, the nonvolatile memory device 100f may include the first structure D1, the third structure D3, the fourth structure D4, and the second structure D2, which are stacked in the vertical direction (the Z direction). The first surface S3a of the third structure D3 may be bonded to the first surface S1a of the first structure D1, and the second surface S3b of the third structure D3 may be bonded to the second surface S4b of the fourth structure D4. The third structure D3 may be directly bonded to the first structure D1 and the fourth structure D4.

The third structure D3 may include the plurality of first bonding pads 133a on the first surface S3a of the third structure D3 and the plurality of second bonding pads 133b on the second surface S3b of the third structure D3. The third structure D3 and the first structure D1 may be physically and electrically connected to each other by direct bonding between the plurality of first bonding pads 133a of the third structure D3 and the plurality of first bonding pads 131a of the first structure D1. In addition, the third structure D3 and the fourth structure D4 may be physically and electrically connected to each other by direct bonding between the plurality of second bonding pads 133b of the third structure D3 and the plurality of second bonding pads 134b of the fourth structure D4. The third interconnect 123 may connect the first peripheral circuit PC1 to the plurality of first bonding pads 133a and the plurality of second bonding pads 133b of the third structure D3.

Figure 11A:
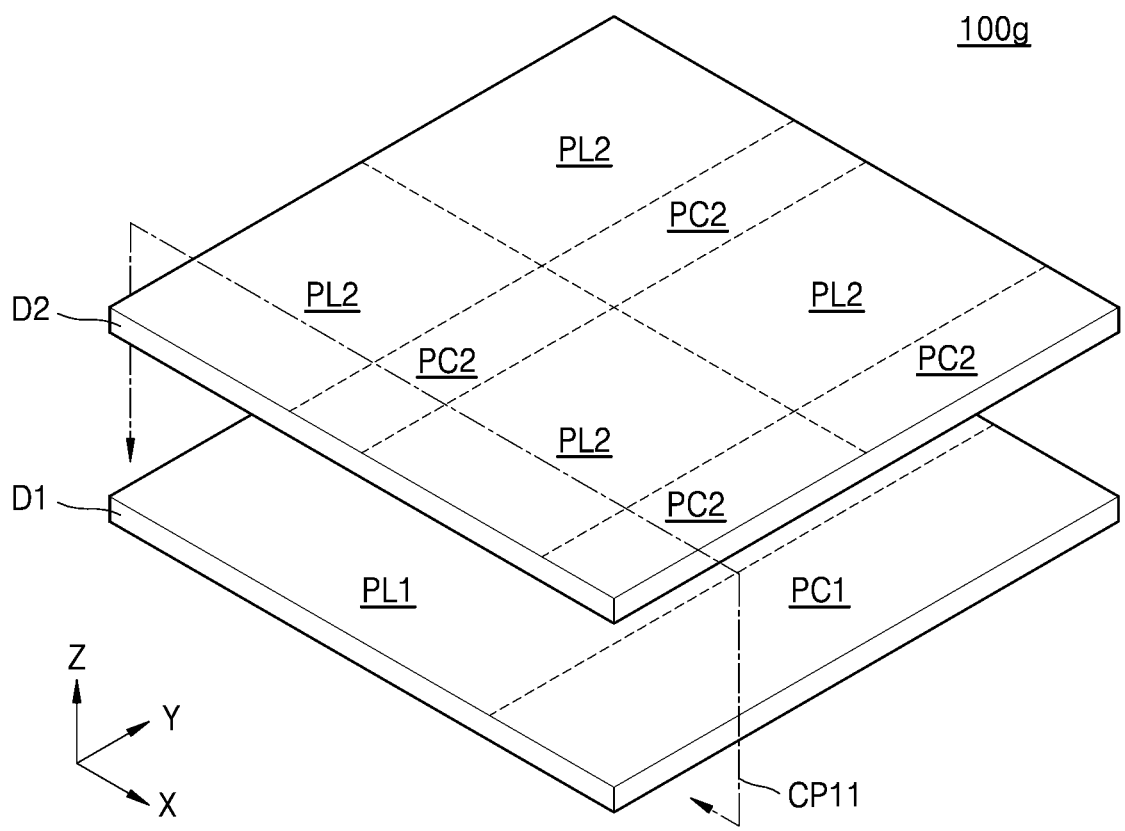
FIG. 11A is an exploded perspective view of a nonvolatile memory device according to an embodiment of the inventive concepts.
Figure 11B:
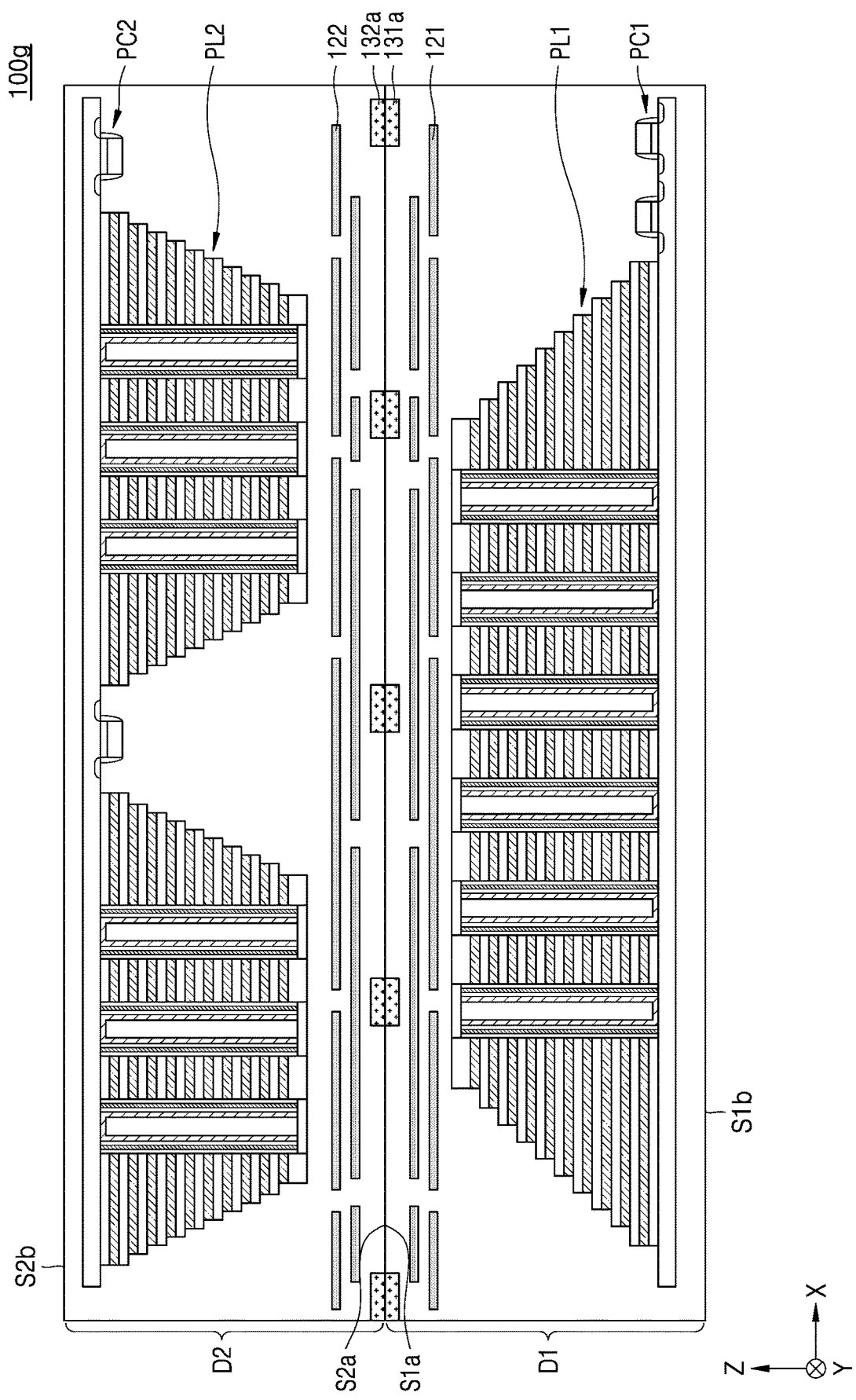
FIG. 11B is a cross-sectional view of the nonvolatile memory device of FIG. 11A along a surface CP11, according to an embodiment of the inventive concepts.

FIG. 11A is an exploded perspective view of a nonvolatile memory device 100g according to an embodiment of the inventive concepts. FIG. 11B is a cross-sectional view of the nonvolatile memory device 100g of FIG. 11A along a surface CP11, according to an embodiment of the inventive concepts. Hereinafter, differences between the nonvolatile memory device 100 shown in FIGS. 4A and 4B and the nonvolatile memory device 100g shown in FIGS. 11A and 11B will be described.

Referring to FIGS. 11A and 11B, the nonvolatile memory device 100g may include the first structure D1 and the second structure D2 on the first structure D1. The first structure D1 may include at least one first plane PL1 and at least one first peripheral circuit PC1. The second structure D2 may include at least one second plane PL2 and at least one second peripheral circuit PC2. That is, a peripheral circuit may be formed together with the at least one first plane PL1 and/or the at least one second plane PL2 in at least one of the first structure D1 and the second structure D2 without being formed in a separate structure (e.g., the third structure D3 in FIG. 4A).

The first surface S1a of the first structure D1 may be bonded to the first surface S2a of the second structure D2. The first structure D1 may be directly bonded to the second structure D2. The first structure D1 and the second structure D2 may be physically and electrically connected to each other by direct bonding between the plurality of first bonding pads 131a of the first structure D1 and the plurality of first bonding pads 132a of the second structure D2.

The first interconnect 121 may connect the at least one first plane PL1 to the plurality of first bonding pads 131a. In addition, the first interconnect 121 may connect a first peripheral circuit PC1 to the at least one first plane PL1. In addition, the first interconnect 121 may connect the first peripheral circuit PC1 to the plurality of first bonding pads 131a. The second interconnect 122 may connect the at least one second plane PL2 to the plurality of first bonding pads 132a. In addition, the second interconnect 122 may connect a second peripheral circuit PC2 to the at least one second plane PL2. In addition, the second interconnect 122 may connect the second peripheral circuit PC2 to the plurality of first bonding pads 132a.

Figure 12A:
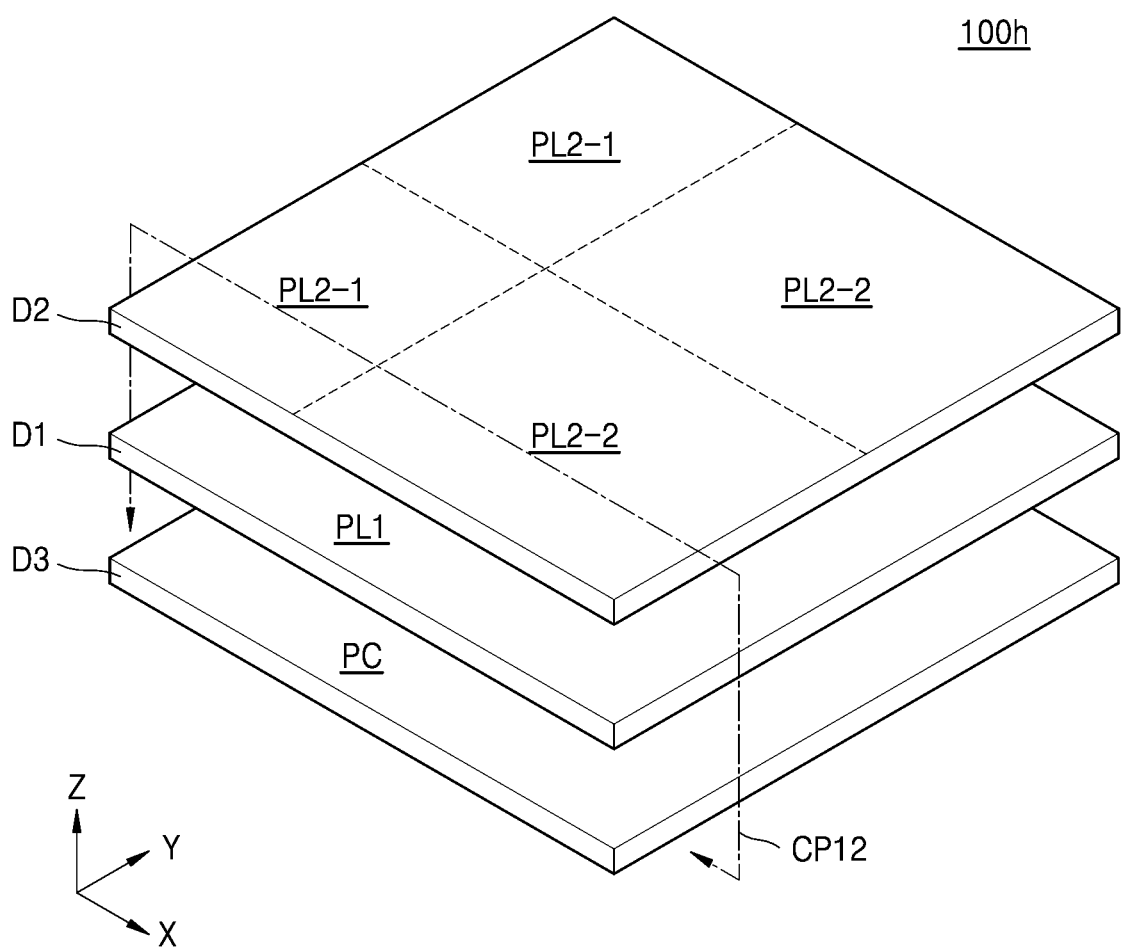
FIG. 12A is an exploded perspective view of a nonvolatile memory device according to an embodiment of the inventive concepts.
Figure 12B:
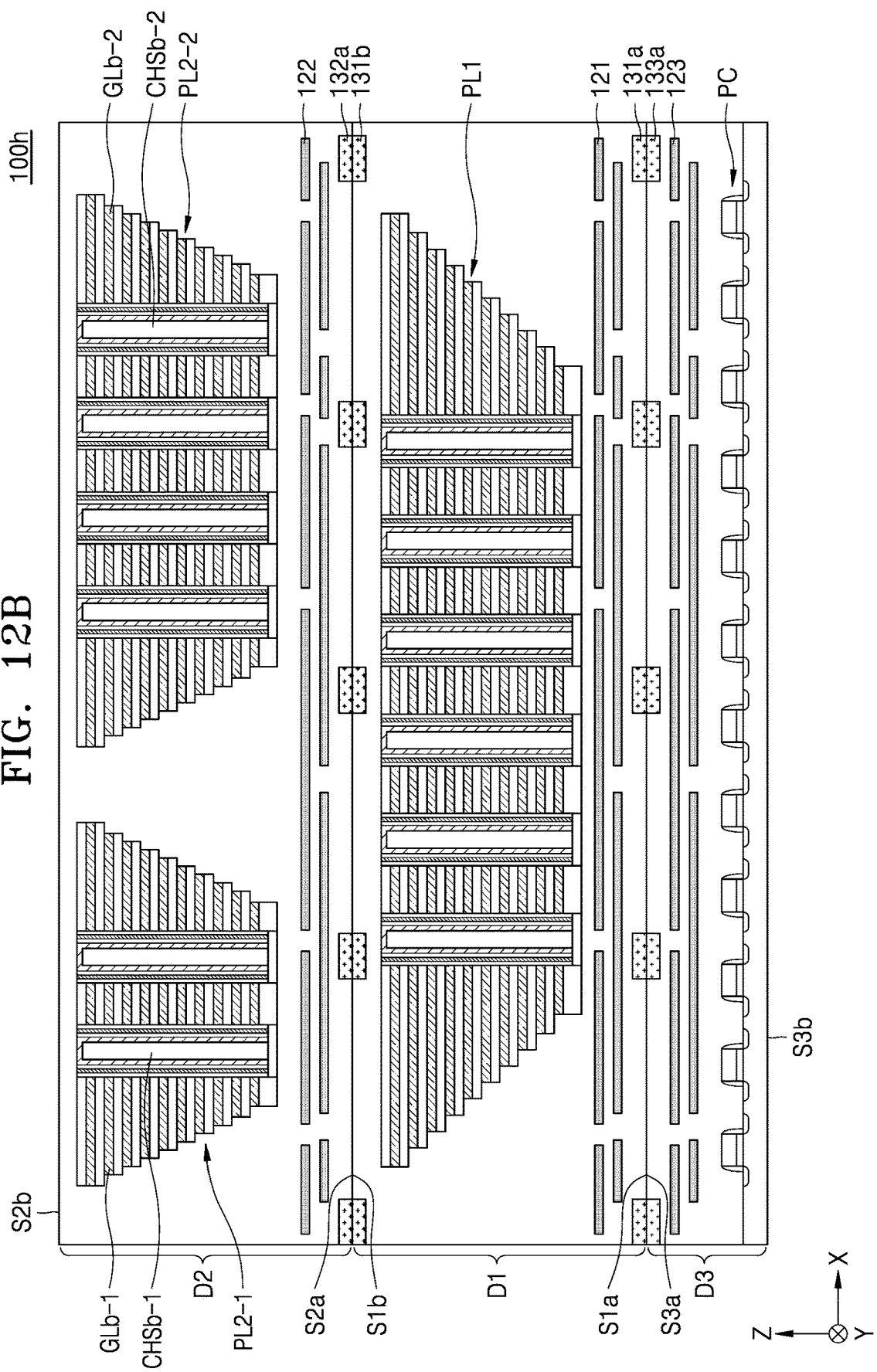
FIG. 12B is a cross-sectional view of the nonvolatile memory device of FIG. 12A along a surface CP12, according to an embodiment of the inventive concepts.

FIG. 12A is an exploded perspective view of a nonvolatile memory device 100h according to an embodiment of the inventive concepts. FIG. 12B is a cross-sectional view of the nonvolatile memory device 100h of FIG. 12A along a surface CP12, according to an embodiment of the inventive concepts. Hereinafter, differences between the nonvolatile memory device 100 shown in FIGS. 4A and 4B and the nonvolatile memory device 100h shown in FIGS. 12A and 12B will be described.

Referring to FIGS. 12A and 12B, the second structure D2 may include a plurality of second planes PL2-1 and PL2-2. Planar areas of the plurality of second planes PL2-1 and PL2-2 may not be identical. For example, a planar area of each of two second planes PL2-1 may be identical, a planar area of each of the other two second planes PL2-2 may be identical, and the planar area of each of the two second planes PL2-1 may be different from the planar area of each of the other two second planes PL2-2. Likewise, in an embodiment in which the first structure D1 includes a plurality of first planes PL1, planar areas of the plurality of first planes PL1 may not be identical.

In some embodiments, as shown in FIG. 12B, the number of channel structures CHSb-1 included in one second plane PL2-1 may be different from the number of channel structures CHSb-2 included in the other one second plane PL2-2. However, in another embodiment, the number of channel structures CHSb-1 included in the one second plane PL2-1 may be the same as the number of channel structures CHSb-2 included in the other one second plane PL2-2.

In some embodiments, as shown in FIG. 12B, the number of gate layers GLb-1 included in the one second plane PL2-1 may be the same as the number of gate layers GLb-2 included in the other one second plane PL2-2. However, in another embodiment, the number of gate layers GLb-1 included in the one second plane PL2-1 may be different from the number of gate layers GLb-2 included in the other one second plane PL2-2.

Figure 13:
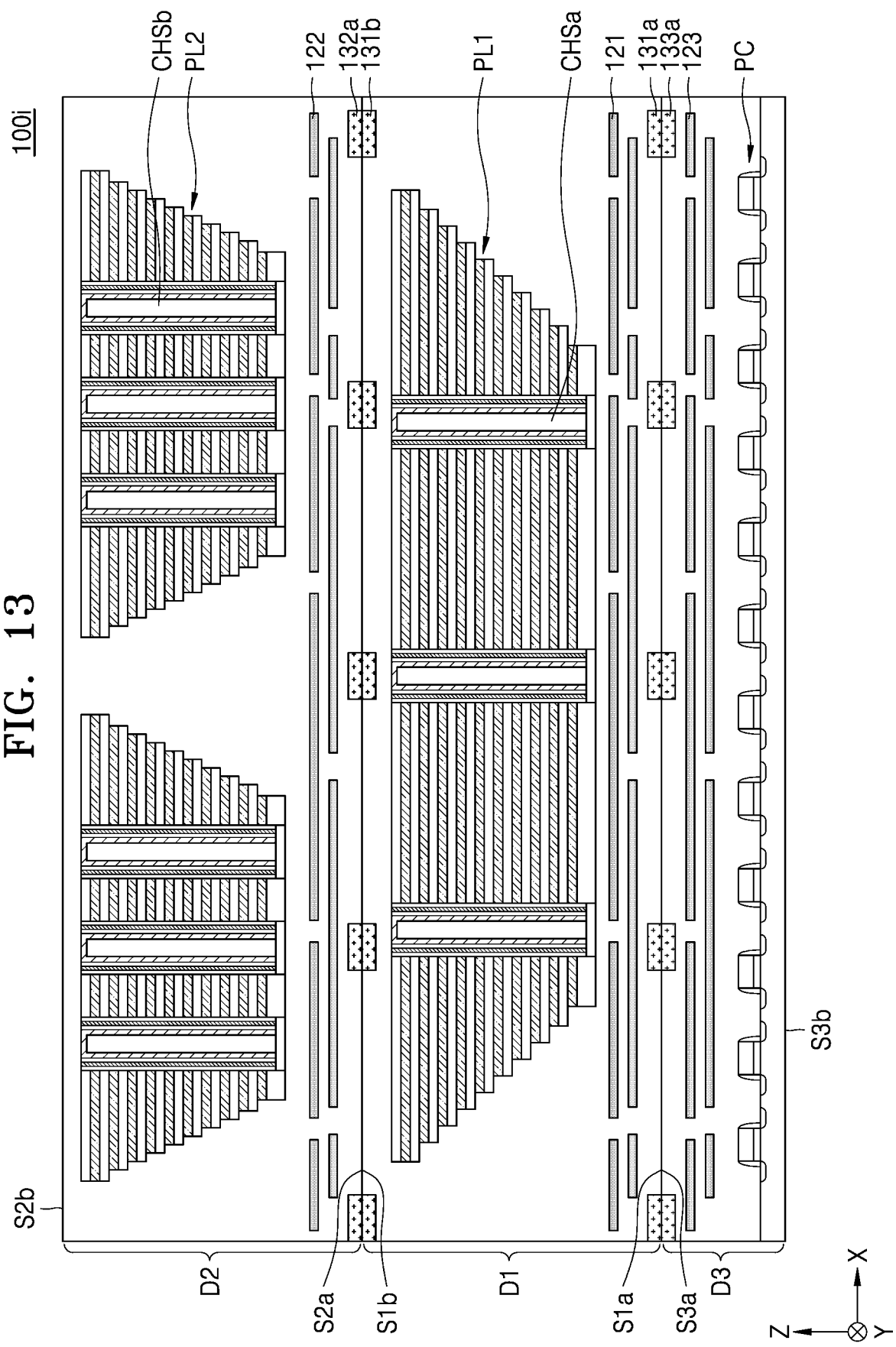
FIG. 13 is a cross-sectional view of a nonvolatile memory device according to an embodiment of the inventive concepts.

FIG. 13 is a cross-sectional view of a nonvolatile memory device 100i according to an embodiment of the inventive concepts. Hereinafter, differences between the nonvolatile memory device 100 shown in FIGS. 4A and 4B and the nonvolatile memory device 100i shown in FIG. 13 will be described.

Referring to FIG. 13, the number of channel structures CHSa included in one first plane PL1 may be the same as the number of channel structures CHSb included in one second plane PL2.

Figure 14:
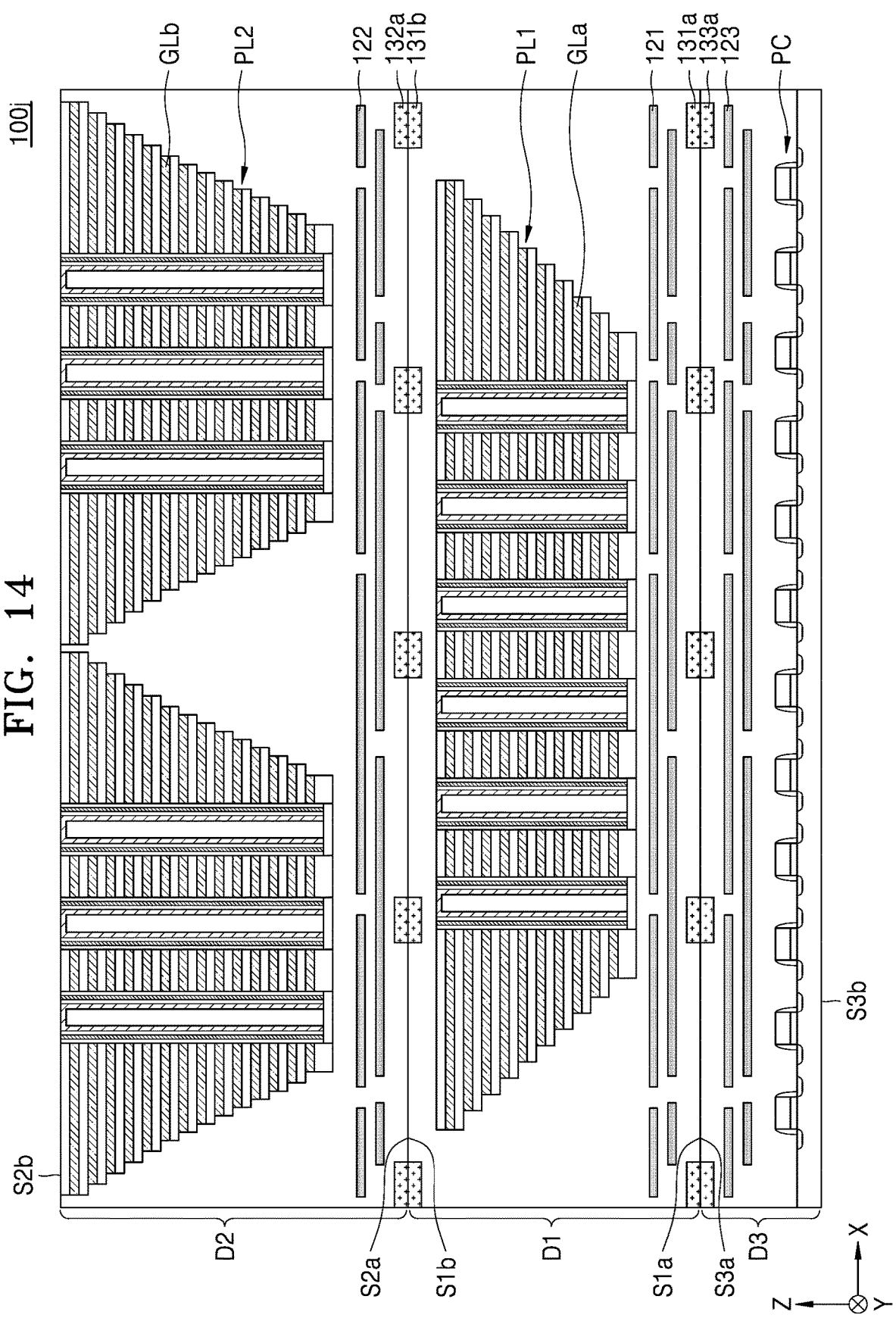
FIG. 14 is a cross-sectional view of a nonvolatile memory device according to an embodiment of the inventive concepts.

FIG. 14 is a cross-sectional view of a nonvolatile memory device 100j according to an embodiment of the inventive concepts. Hereinafter, differences between the nonvolatile memory device 100 shown in FIGS. 4A and 4B and the nonvolatile memory device 100j shown in FIG. 14 will be described.

Referring to FIG. 14, the number (e.g., 10 in FIG. 14) of gate layers GLa included in one first plane PL1 may be different from the number (e.g., 14 in FIG. 14) of gate layers GLb included in one second plane PL2. In the embodiment shown in FIG. 14, the number (e.g., 10 in FIG. 14) of gate layers GLa included in the one first plane PL1 may be less than the number (e.g., 14 in FIG. 14) of gate layers GLb included in the one second plane PL2. However, in another embodiment, the number of gate layers GLa included in the one first plane PL1 may be greater than the number of gate layers GLb included in the one second plane PL2.

Figure 15:
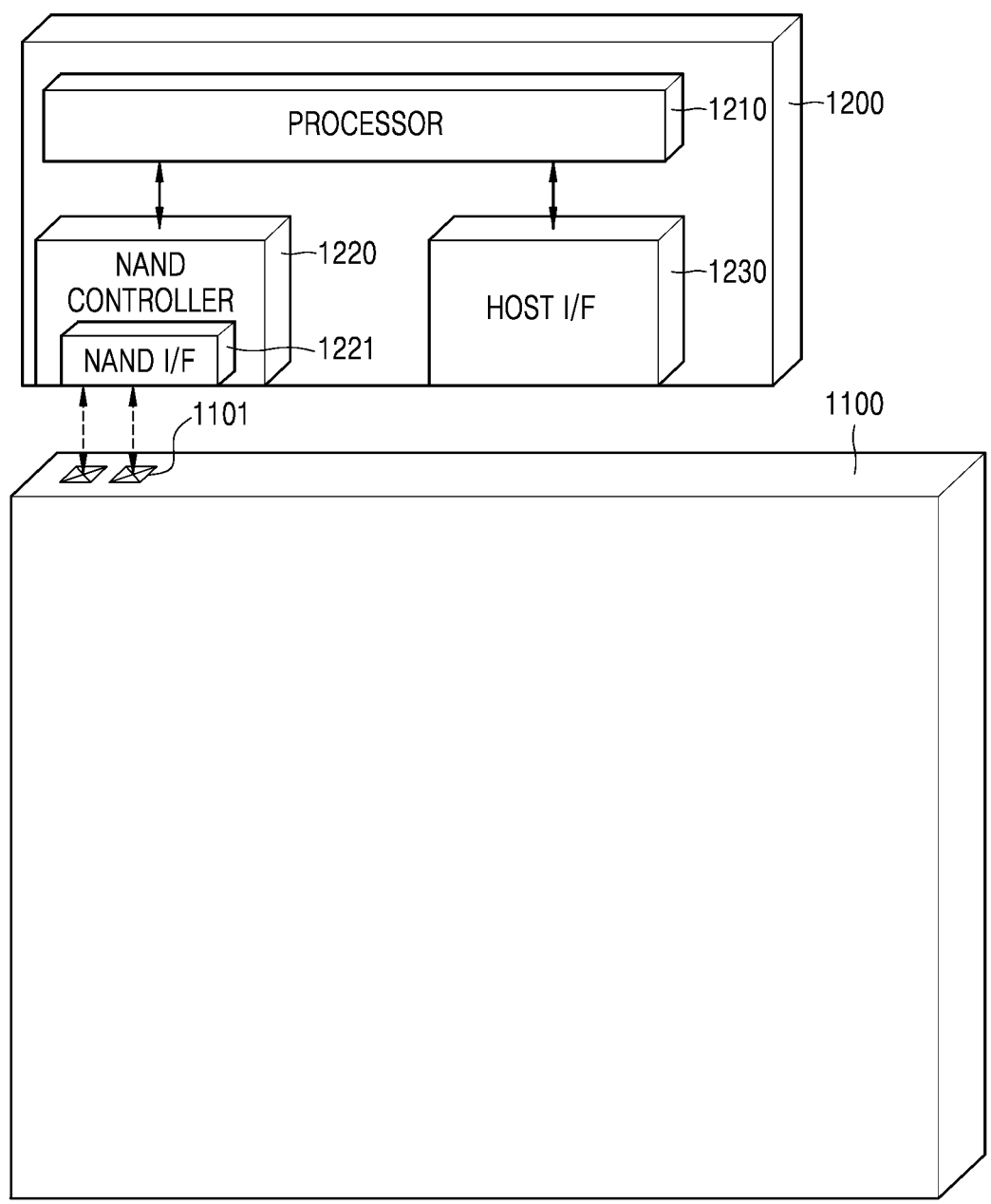
FIG. 15 is a schematic view of a data storage system including a nonvolatile memory device, according to an embodiment of the inventive concepts.

FIG. 15 is a schematic view of a data storage system 1000 including a nonvolatile memory device, according to an embodiment of the inventive concepts.

Referring to FIG. 15, the data storage system 1000 may include a nonvolatile memory device 1100 and a memory controller 1200 electrically connected to the nonvolatile memory device 1100. The data storage system 1000 may be a solid state drive (SSD) device, a universal serial bus (USB) device, a computing system, a medical device, or a communication device including, for example, at least one nonvolatile memory device 1100.

The nonvolatile memory device 1100 may be the nonvolatile memory device 100, 100a, 100b, 100c, 100d, 100e, 100f, 100g, 100h, 100i, or 100j described with reference to FIGS. 1 to 14 or a combination thereof. The nonvolatile memory device 1100 may communicate with the memory controller 1200 through an input-output pad 1101 electrically connected to the control logic 14 (see FIG. 1).

The memory controller 1200 may include a processor 1210, a NAND controller 1220, and a host interface 1230. The memory controller 1200 may control the nonvolatile memory device 1100. In some embodiments, the data storage system 1000 may include a plurality of nonvolatile memory devices 1100, and in this case, the memory controller 1200 may control the plurality of nonvolatile memory devices 1100.

The processor 1210 may control a general operation of the data storage system 1000 including the memory controller 1200. The processor 1210 may operate according to certain firmware and control the NAND controller 1220 to access the nonvolatile memory device 1100. The NAND controller 1220 may include a NAND interface 1221 configured to process communication with the nonvolatile memory device 1100. Through the NAND interface 1221, a control command for controlling the nonvolatile memory device 1100, data to be written on a plurality of memory cells (MC1 to MC8 in the nonvolatile memory device 1100, data read from the plurality of memory cells MC1 to MC8) in the nonvolatile memory device 1100, and the like may be transferred. The host interface 1230 may provide a communication function between the data storage system 1000 and an external host. When a control command is received from the external host through the host interface 1230, the processor 1210 may control the nonvolatile memory device 1100 in response to the control command.

Figure 16:
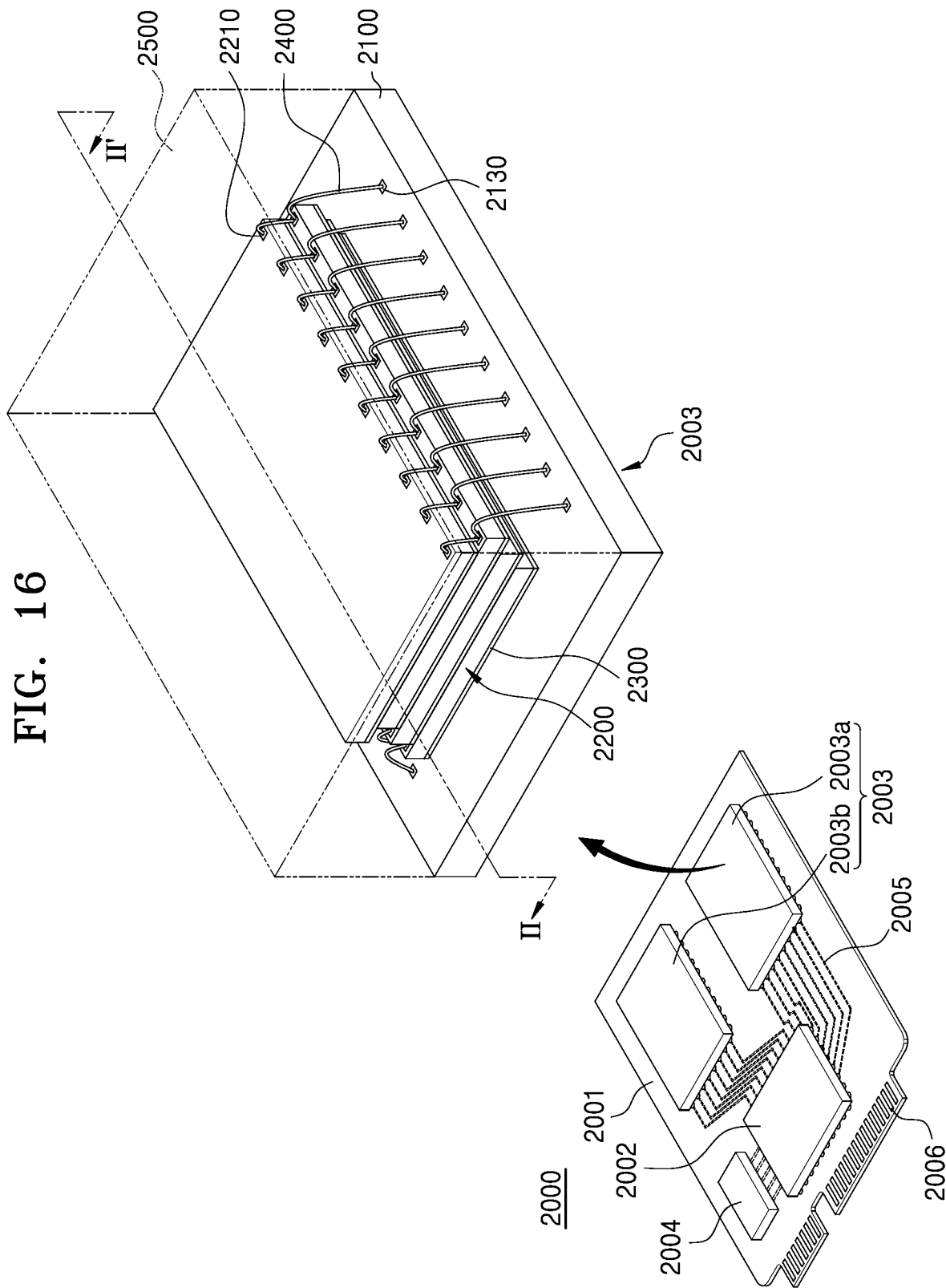
FIG. 16 is a perspective view of a data storage system including a nonvolatile memory device, according to an embodiment of the inventive concepts.

FIG. 16 is a perspective view of a data storage system 2000 including a nonvolatile memory device, according to an embodiment of the inventive concepts.

Referring to FIG. 16, the data storage system 2000 according to an example embodiment of the inventive concepts may include a main substrate 2001 and a memory controller 2002, a semiconductor package 2003, and dynamic random access memory (DRAM) 2004 mounted on the main substrate 2001. The semiconductor package 2003 and the DRAM 2004 may be connected to the memory controller 2002 through a plurality of wiring patterns 2005 formed on the main substrate 2001.

The main substrate 2001 may include a connector 2006 including a plurality of pins coupled to an external host. The number and the arrangement of pins in the connector 2006 may vary according to a communication interface between the data storage system 2000 and the external host. In example embodiments, the data storage system 2000 may communicate with the external host according to any one of interfaces such as a USB interface, a peripheral component interconnect express (PCI-Express) interface, a serial advanced technology attachment (SATA) interface, and an M-Phy interface for a universal flash storage (UFS). In example embodiments, the data storage system 2000 may operate by power received from the external host through the connector 2006. The data storage system 2000 may further include a power management integrated circuit (PMIC) configured to distribute the power received from the external host to the memory controller 2002 and the semiconductor package 2003.

The memory controller 2002 may write and/or read data on and/or from the semiconductor package 2003 and improve an operating speed of the data storage system 2000.

The DRAM 2004 may be a buffer memory configured to mitigate a speed difference between the semiconductor package 2003, which is a data storage space, and the external host. The DRAM 2004 included in the data storage system 2000 may operate as a kind of cache memory and provide a space in which data is temporarily stored in a control operation on the semiconductor package 2003. When the DRAM 2004 is included in the data storage system 2000, the memory controller 2002 may further include a DRAM controller configured to control the DRAM 2004 in addition to a NAND controller configured to control the semiconductor package 2003.

The semiconductor package 2003 may include first and second semiconductor packages 2003a and 2003b separated from each other. Each of the first and second semiconductor packages 2003a and 2003b may include a plurality of semiconductor chips 2200. Each of the first and second semiconductor packages 2003a and 2003b may include a package substrate 2100, the plurality of semiconductor chips 2200 on the package substrate 2100, an adhesive layer 2300 beneath each of the plurality of semiconductor chips 2200, a plurality of connection structures 2400 electrically connecting the plurality of semiconductor chips 2200 to the package substrate 2100, and a molding layer 2500 covering the plurality of semiconductor chips 2200 and the plurality of connection structures 2400 on the package substrate 2100.

The package substrate 2100 may be a printed circuit board including a plurality of package upper pads 2130. Each of the plurality of semiconductor chips 2200 may include an input-output pad 2210. Each of the plurality of semiconductor chips 2200 may be the nonvolatile memory device 100, 100a, 100b, 100c, 100d, 100e, 100f, 100g, 100h, 100i, or 100j described with reference to FIGS. 1 to 14 or a combination thereof.

In example embodiments, the plurality of connection structures 2400 may be bonding wires electrically connecting the input-output pad 2210 to the plurality of package upper pads 2130. Therefore, in the first and second semiconductor packages 2003a and 2003b, the plurality of semiconductor chips 2200 may be electrically connected to each other by a bonding wire scheme and electrically connected to the plurality of package upper pads 2130 of the package substrate 2100. In example embodiments, in the first and second semiconductor packages 2003a and 2003b, the plurality of semiconductor chips 2200 may be electrically connected to each other through a connection structure including through silicon vias (TSVs) instead of the plurality of connection structures 2400 of the bonding wire scheme.

In example embodiments, the memory controller 2002 and the plurality of semiconductor chips 2200 may be included in one package. In example embodiments, the memory controller 2002 and the plurality of semiconductor chips 2200 may be mounted on a separate interposer substrate other than the main substrate 2001, and the memory controller 2002 and the plurality of semiconductor chips 2200 may be connected to each other through wirings formed on the interposer substrate.

Figure 17:
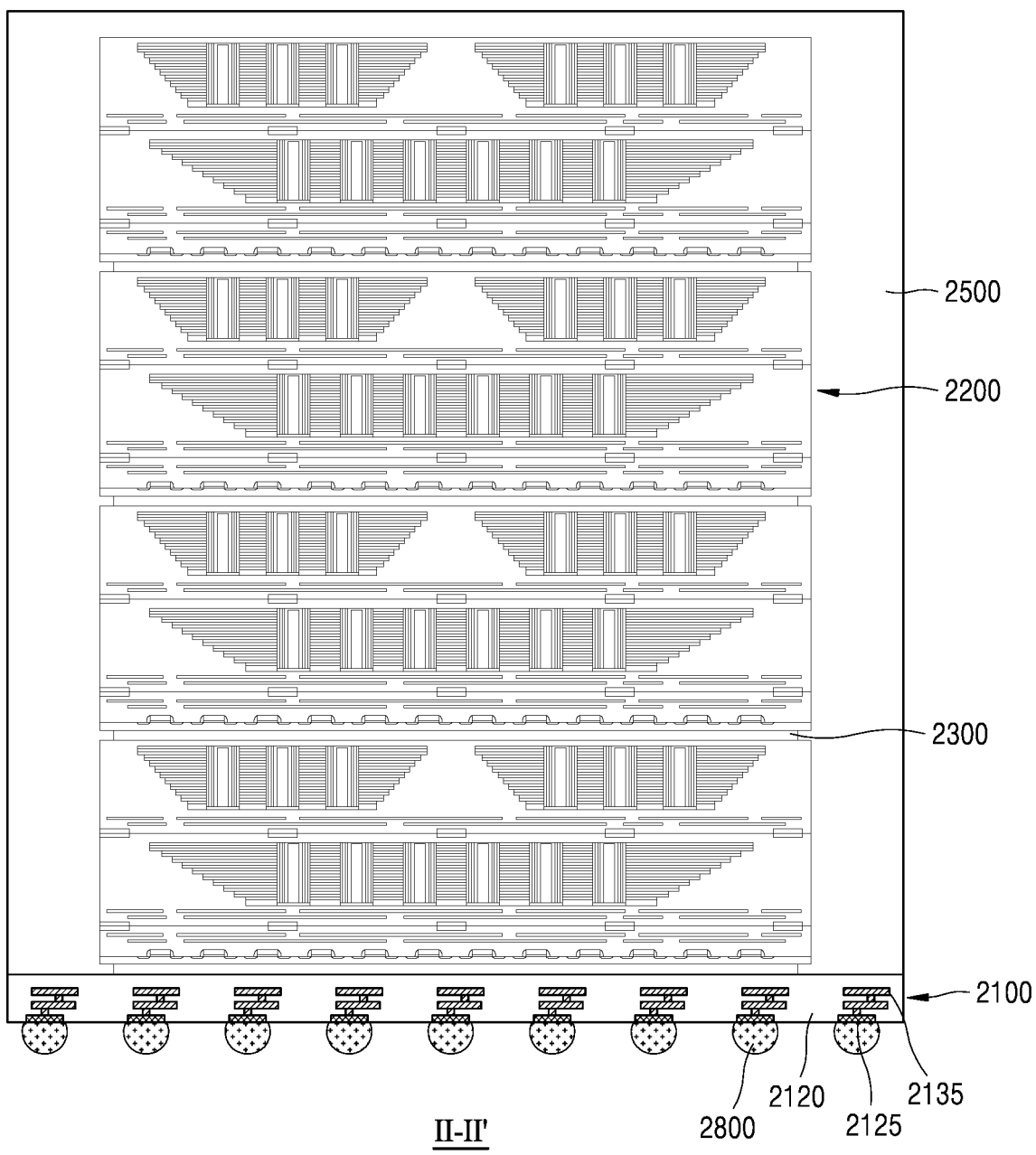
FIG. 17 is a cross-sectional view of a semiconductor package taken along the line II-II' of FIG. 16 including a nonvolatile memory device, according to an embodiment of the inventive concepts.

FIG. 17 is a cross-sectional view of the semiconductor package 2003 (see FIG. 16) taken along the line II-IP of FIG. 16, including a nonvolatile memory device, according to an embodiment of the inventive concepts.

Referring to FIG. 17, in the semiconductor package 2003, the package substrate 2100 may be a printed circuit board. The package substrate 2100 may include a package substrate body part 2120, the plurality of package upper pads 2130 (see FIG. 16) on an upper surface of the package substrate body part 2120, a plurality of lower pads 2125 arranged on or exposed through a lower surface of the package substrate body part 2120, and a plurality of internal wirings 2135 electrically connecting the plurality of package upper pads 2130 (see FIG. 16) to the plurality of lower pads 2125 inside the package substrate body part 2120. As shown in FIG. 16, the plurality of package upper pads 2130 may be electrically connected to the plurality of connection structures 2400. As shown in FIG. 17, the plurality of lower pads 2125 may be connected, through a plurality of conductive bumps 2800, to the plurality of wiring patterns 2005 on the main substrate 2001 of the data storage system 2000 shown in FIG. 16. Each of the plurality of semiconductor chips 2200 may be the nonvolatile memory device 100, 100a, 100b, 100c, 100d, 100e, 100f, 100g, 100h, 100i, or 100j described with reference to FIGS. 1 to 14 or a combination thereof.

While the inventive concepts have been particularly shown and described with reference to embodiments thereof, it will be understood that various changes in form and details may be made therein without departing from the scope of the following claims.

What is claimed is:

1. A nonvolatile memory device comprising:
a first structure comprising at least one first memory plane; and
a second structure bonded to the first structure and comprising at least one second memory plane,
wherein a number of the at least one first memory plane included in the first structure is different from a number of the at least one second memory plane included in the second structure,
wherein each of the at least one first memory plane and the at least one second memory plane includes a cell region comprising a plurality of channel structures; and a stair region comprising a plurality of interlayer insulating layers and a plurality of gate layers having a stair shape, and
wherein the stair region of the at least one second memory plane overlaps the cell region of the at least one first memory plane in a plan view.

2. The nonvolatile memory device of claim 1, wherein the nonvolatile memory device comprises a three-dimensional NAND flash memory device.

3. The nonvolatile memory device of claim 1, wherein the second structure is directly bonded to the first structure.

4. The nonvolatile memory device of claim 1, wherein each of the at least one first memory plane and the at least one second memory plane respectively comprises a plurality of blocks, and
wherein each of the plurality of blocks is a minimum unit of a delete operation.

5. The nonvolatile memory device of claim 1, wherein a planar area of the first structure is the same as a planar area of the second structure.

6. The nonvolatile memory device of claim 1, further comprising a third structure bonded to the first structure,
wherein the third structure comprises a peripheral circuit.

7. The nonvolatile memory device of claim 1, wherein the number of the at least one second memory plane included in the second structure is an even number times the number of the at least one first memory plane included in the first structure.

8. The nonvolatile memory device of claim 1, wherein the number of the at least one first memory plane included in the first structure is 1.

9. The nonvolatile memory device of claim 1, wherein the at least one first memory plane is arranged horizontally, and the at least one second memory plane is arranged horizontally.

10. A nonvolatile memory device comprising:
a first structure; and
a second structure on the first structure,
wherein the first structure comprises:
at least one first memory plane; and
a plurality of first bonding pads on a first surface of the first structure and connected to the at least one first memory plane,
wherein the second structure comprises:
at least one second memory plane; and
a plurality of second bonding pads on a second surface of the second structure and connected to the at least one second memory plane,
wherein the plurality of first bonding pads are in contact with the plurality of second bonding pads, respectively,
wherein a number of the at least one first memory plane included in the first structure is different from a number of the at least one second memory plane included in the second structure,
wherein each of the at least one first memory plane and the at least one second memory plane comprises a plurality of interlayer insulating layers and a plurality of gate layers that are alternately stacked in a vertical direction,
wherein a plurality of channel structures passes through the plurality of interlayer insulating layers and the plurality of gate layers,
wherein each of the at least one first memory plane and the at least one second memory plane comprises: a cell region comprising the plurality of channel structures; and a stair region comprising the plurality of interlayer insulating layers and the plurality of gate layers having a stair shape, and
wherein the cell region of one of the at least one first memory plane overlaps the stair region of the at least one second memory plane in the vertical direction.

11. The nonvolatile memory device of claim 10, further comprising a third structure on the second structure,
wherein the third structure comprises:
a peripheral circuit; and
a plurality of third bonding pads on a third surface of the third structure and connected to the peripheral circuit,
wherein the second structure further comprises a plurality of fourth bonding pads on a fourth surface of the second structure, which is opposite to the second surface of the second structure, and connected to the at least one second memory plane, and
wherein the plurality of third bonding pads are in contact with the plurality of fourth bonding pads, respectively.

12. The nonvolatile memory device of claim 10, wherein a number of the plurality of channel structures included in each of the at least one first memory plane is different from a number of the plurality of channel structures included in each of the at least one second memory plane.

13. The nonvolatile memory device of claim 10, wherein the at least one first memory plane comprises a plurality of first memory planes,
wherein the at least one second memory plane comprises a plurality of second memory planes,
wherein a planar area of each of the plurality of first memory planes is the same, and
wherein a planar area of each of the plurality of second memory planes is the same.

14. The nonvolatile memory device of claim 13, wherein the planar area of each of the plurality of first memory planes is different from the planar area of each of the plurality of second memory planes.

15. The nonvolatile memory device of claim 10, wherein the at least one first memory plane comprises first memory cells and the at least one second memory plane comprises second memory cells, and wherein the nonvolatile memory device is configured to perform a first read operation, a first write operation, or a first delete operation on the first memory cells of the at least one first memory plane simultaneously with a second read operation, a second write operation, or a second delete operation on the second memory cells of the at least one second memory plane.

16. The nonvolatile memory device of claim 10, wherein the number of the at least one second memory plane is greater than the number of the at least one first memory plane.

17. A data storage system comprising:
a nonvolatile memory device comprising a first structure and a second structure bonded to the first structure; and
a memory controller electrically connected to the nonvolatile memory device and configured to control the nonvolatile memory device,
wherein the first structure comprises at least one first memory plane,
wherein the second structure comprises at least one second memory plane,
wherein a number of the at least one first memory plane included in the first structure is different from a number of the at least one second memory plane included in the second structure
wherein each of the at least one first memory plane and the at least one second memory plane includes a cell region comprising a plurality of channel structures; and a stair region comprising a plurality of interlayer insulating layers and a plurality of gate layers having a stair shape, and
wherein the stair region of the at least one second memory plane overlaps the cell region of the at least one first memory plane in a vertical direction.

18. The data storage system of claim 17, wherein a first surface of the first structure is in contact with a second surface of the second structure,
wherein the first structure further comprises a plurality of first bonding pads on the first surface of the first structure,
wherein the second structure further comprises a plurality of second bonding pads on the second surface of the second structure, and
wherein the plurality of first bonding pads are in contact with the plurality of second bonding pads, respectively.

\* \* \* \* \*